(12) United States Patent
Krull et al.

(10) Patent No.: US 7,723,233 B2
(45) Date of Patent: May 25, 2010

(54) SEMICONDUCTOR DEVICE AND METHOD OF FABRICATING A SEMICONDUCTOR DEVICE

(75) Inventors: Wade A Krull, Marblehead, MA (US); Dale C. Jacobson, Salem, NH (US)

(73) Assignee: Semequip, Inc., Billerica, MA (US)

( * ) Notice: Subject to any disclaimer, the term of this patent is extended or adjusted under 35 U.S.C. 154(b) by 590 days.

(21) Appl. No.: 10/519,700

(22) PCT Filed: Jun. 18, 2003

(86) PCT No.: PCT/US03/19085

§ 371 (c)(1), (2), (4) Date: Sep. 14, 2005

(87) PCT Pub. No.: WO2004/003970

PCT Pub. Date: Jan. 8, 2004

(65) Prior Publication Data

US 2006/0099812 A1    May 11, 2006

Related U.S. Application Data

(60) Provisional application No. 60/392,023, filed on Jun. 26, 2002, provisional application No. 60/391,802, filed on Jun. 26, 2002.

(51) Int. Cl.
*H01L 21/302* (2006.01)

(52) U.S. Cl. ................ 438/690; 438/515; 438/653; 438/657; 438/702; 438/710; 438/787; 257/296; 257/306; 257/330

(58) Field of Classification Search ............. 438/690; 257/296
See application file for complete search history.

(56) References Cited

U.S. PATENT DOCUMENTS 3,607,449 A * 9/1971 Tokuyama et al. ........ 438/535

(Continued)

FOREIGN PATENT DOCUMENTS

EP        0 219 243 A      4/1987

(Continued)

OTHER PUBLICATIONS

D. Marinskiy, Mat. Res.Soc.Symp.Proc. vol. 669, (2001), pp. J2.5.1-J2.5.6.*

(Continued)

*Primary Examiner*—Nadine Norton
*Assistant Examiner*—Maki Angadi
(74) *Attorney, Agent, or Firm*—John S. Paniaguas; Katten Muchin Rosenman LLP

(57) ABSTRACT

A method is proposed for the fabrication of the gate electrode of a semiconductor device such that the effects of gate depletion are minimized. The method is comprised of a dual deposition process wherein the first step is a very thin layer that is doped very heavily by ion implantation. The second deposition, with an associated ion implant for doping, completes the gate electrode. With the two-deposition process, it is possible to maximize the doping at the gate electrode/gate dielectric interface while minimizing risk of boron penetration of the gate dielectric. A further development of this method includes the patterning of both gate electrode layers with the advantage of utilizing the drain extension and source/drain implants as the gate doping implants and the option of offsetting the two patterns to create an asymmetric device. A method is also provided for the formation of shallow junctions in a semiconductor substrate by diffusion of dopant from an implanted layer contained within a dielectric layer into the semiconductor surface. Further, the ion implanted layer is provided with a second implanted species, such as hydrogen, in addition to the intended dopant species, wherein said species enhances the diffusivity of the dopant in the dielectric layer.

23 Claims, 21 Drawing Sheets

U.S. PATENT DOCUMENTS

| | | | |
|---|---|---|---|
| 5,314,832 A | | 5/1994 | Deleonibus et al. |
| 5,462,884 A | | 10/1995 | Taniguchi et al. |
| 5,688,706 A | | 11/1997 | Tseng |
| 5,773,337 A | * | 6/1998 | Lee .......................... 438/199 |
| 5,801,086 A | | 9/1998 | Lee et al. |
| 5,817,561 A | | 10/1998 | Park et al. |
| 5,828,104 A | | 10/1998 | Mizushima et al. |
| 5,837,598 A | * | 11/1998 | Aronowitz et al. .......... 438/532 |
| 5,885,877 A | * | 3/1999 | Gardner et al. .............. 438/300 |
| 5,930,634 A | | 7/1999 | Hause et al. |
| 6,013,332 A | * | 1/2000 | Goto et al. .................. 427/530 |
| 6,069,061 A | * | 5/2000 | Lin et al. .................... 438/517 |
| 6,080,630 A | | 6/2000 | Milic-Strkalj et al. |
| 6,288,403 B1 | | 9/2001 | Horsky et al. |
| 6,297,109 B1 | | 10/2001 | Chan et al. |
| 6,333,229 B1 | | 12/2001 | Furukawa |
| 6,690,050 B2 | * | 2/2004 | Taniguchi et al. ........... 257/296 |
| 6,693,051 B2 | * | 2/2004 | Muller et al. ............... 438/787 |

FOREIGN PATENT DOCUMENTS

| | | |
|---|---|---|
| EP | 1 093 149 A | 4/2001 |
| JP | 1225117 | 9/1989 |
| JP | 3129774 | 6/1991 |
| JP | 4010620 | 1/1992 |
| JP | 4112544 | 4/1992 |
| JP | 5211330 | 8/1993 |
| JP | 11103050 | 4/1999 |
| JP | 2000277626 | 10/2000 |
| JP | 2002164536 | 6/2002 |
| WO | WO 99/65070 A | 12/1999 |
| WO | WO 01/43175 A | 6/2001 |
| WO | WO 01/69668 | 9/2001 |

OTHER PUBLICATIONS

G. Mannino, Nuclear Instruments and Methods in Physics Research B 186, (2002), pp. 246-255.*

S. Wolf, Silicon Processing for the VLSI Era, vol. 3, Lattice Press (1995), pp. 207-208 and 222-223.*

J. Sc hmitz et al. Ultra-shallow junction formation by outdiiffusion from implanted oxide, IEEE (1988).*

Schmitz J. et al: "Ultra-shallow junction formation by outdiffusion from implanted oxide" 195$^{th}$ Meeting of the Electrochemical Society, 1998, pp. 1000-1012, XP002434976 Washington.

Fair R: "Physical models of boron diffusion in ultrathin gate oxides" Journal of the Electrochemical Society, vol. 144, No. 2, Feb. 1997, pp. 708-717, XP002434977.

Search Report.

* cited by examiner

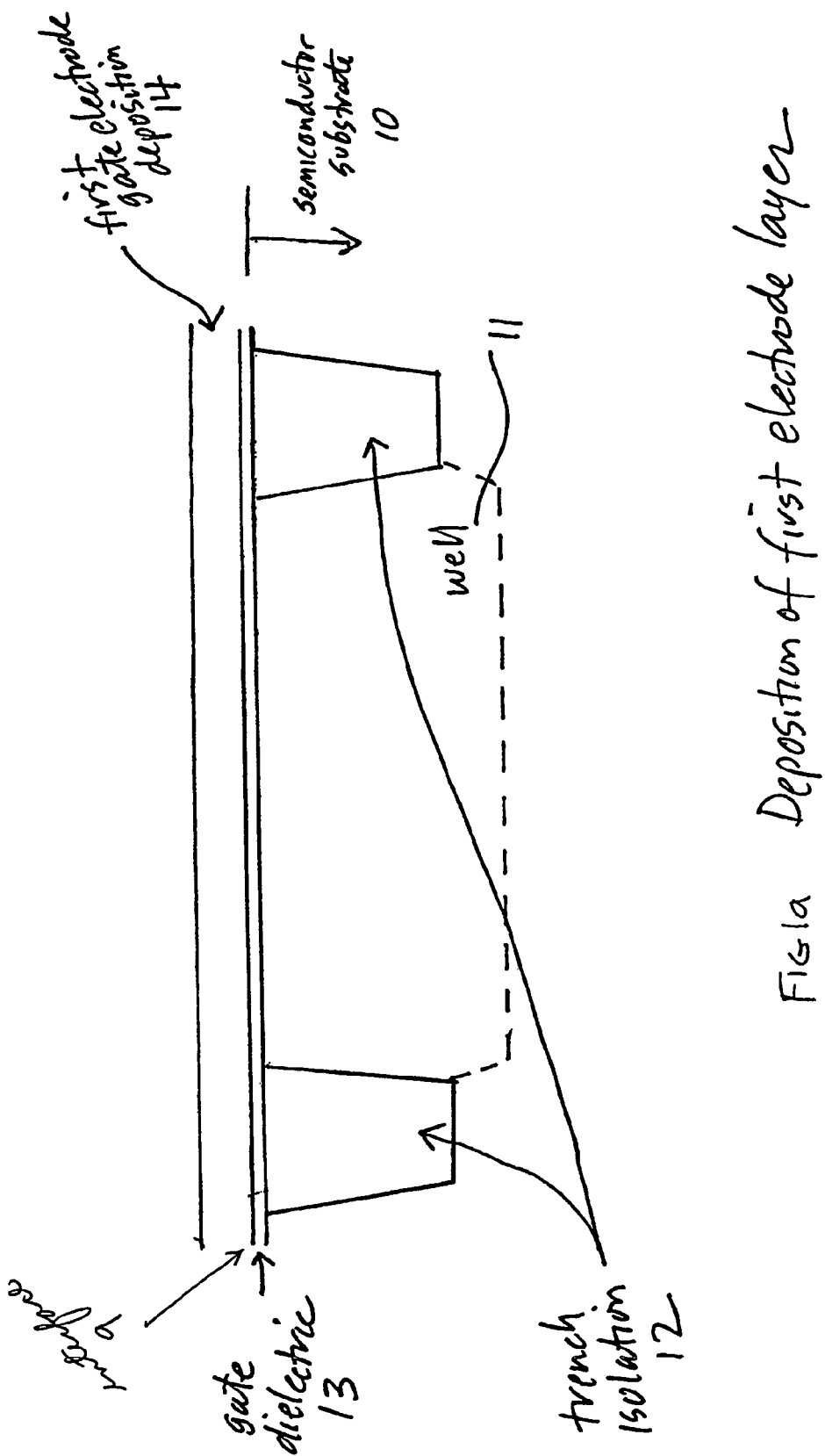

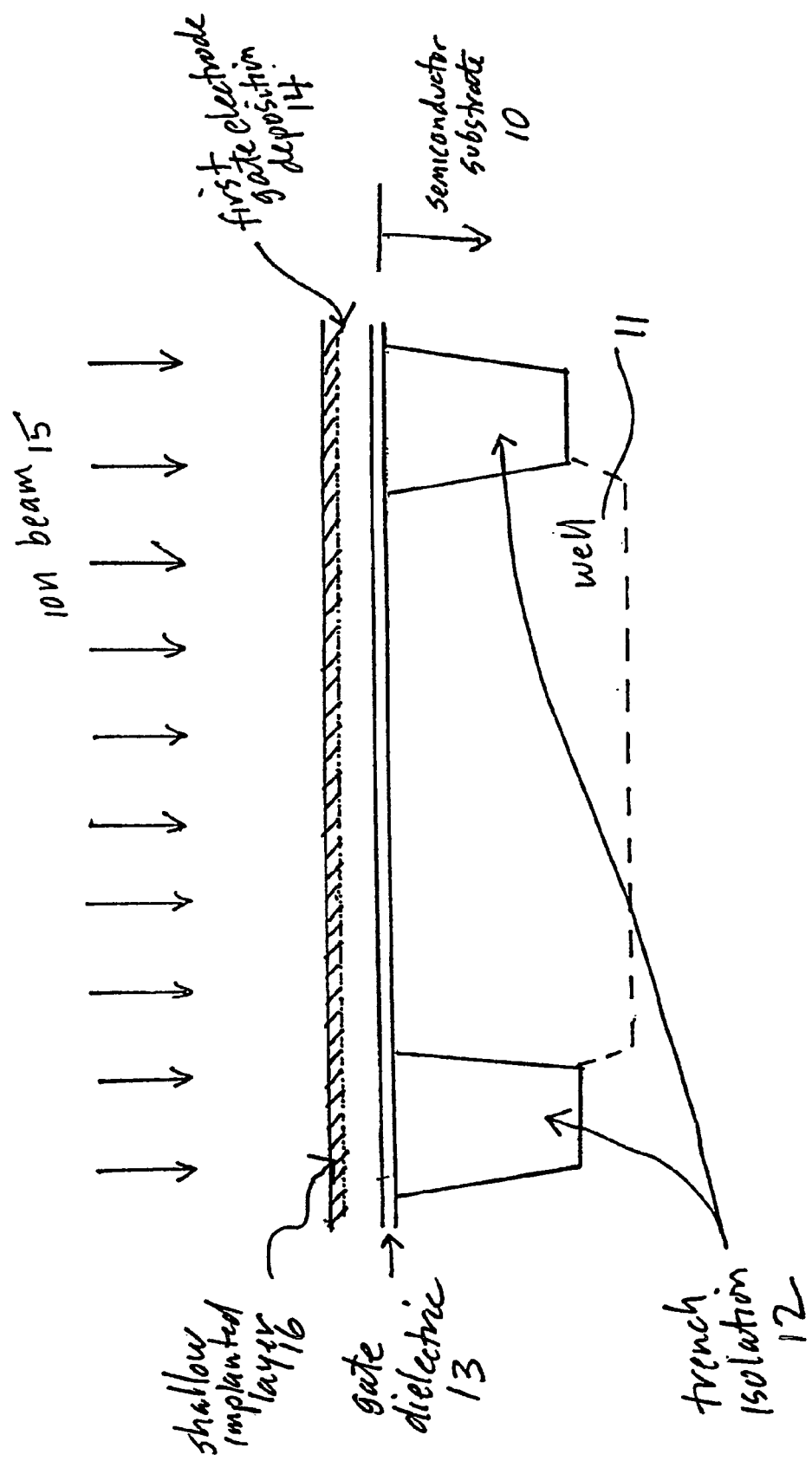
FIG 1B  Process through first ion implant

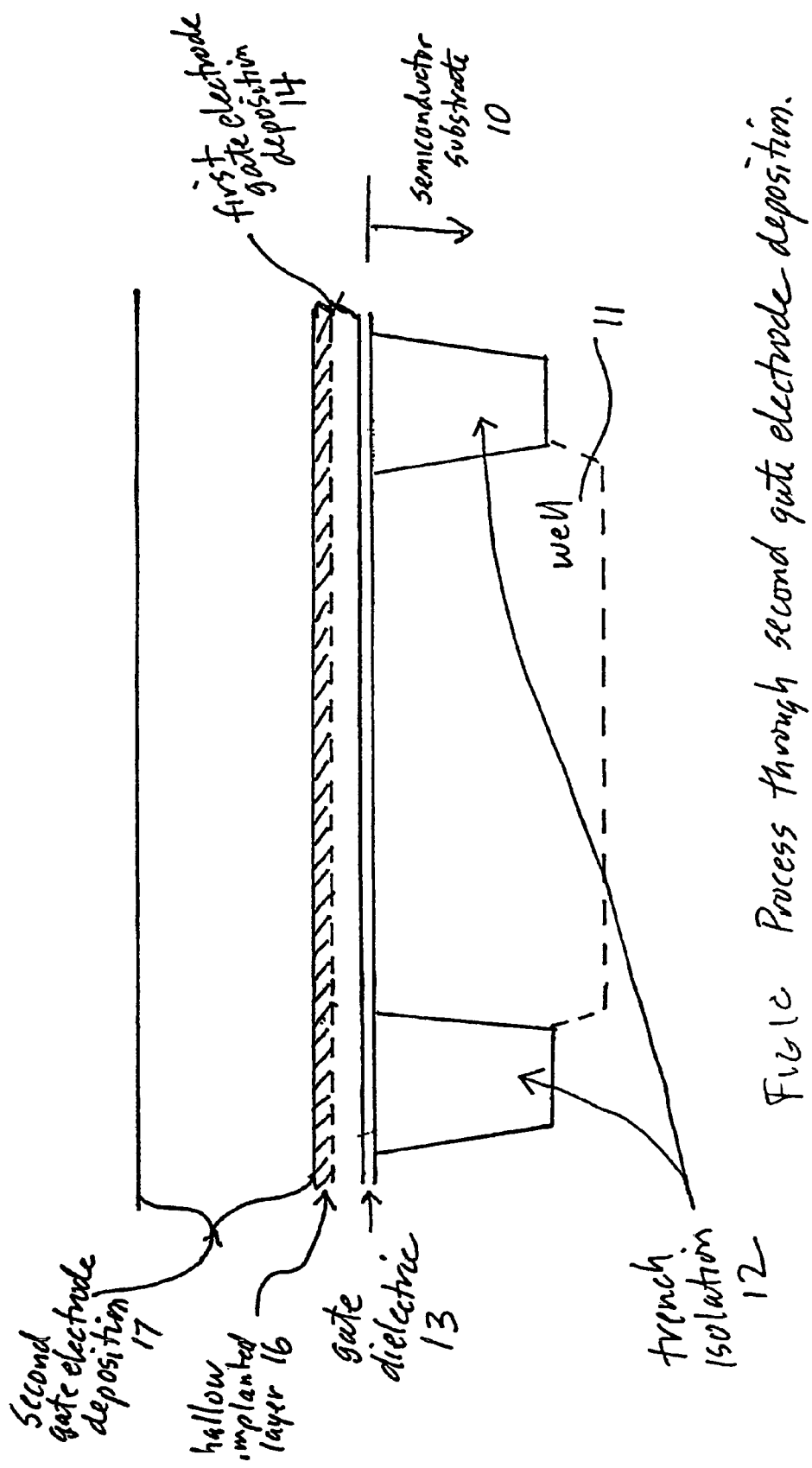
FIG 1c Process through second gate electrode deposition.

Process through second ion implant

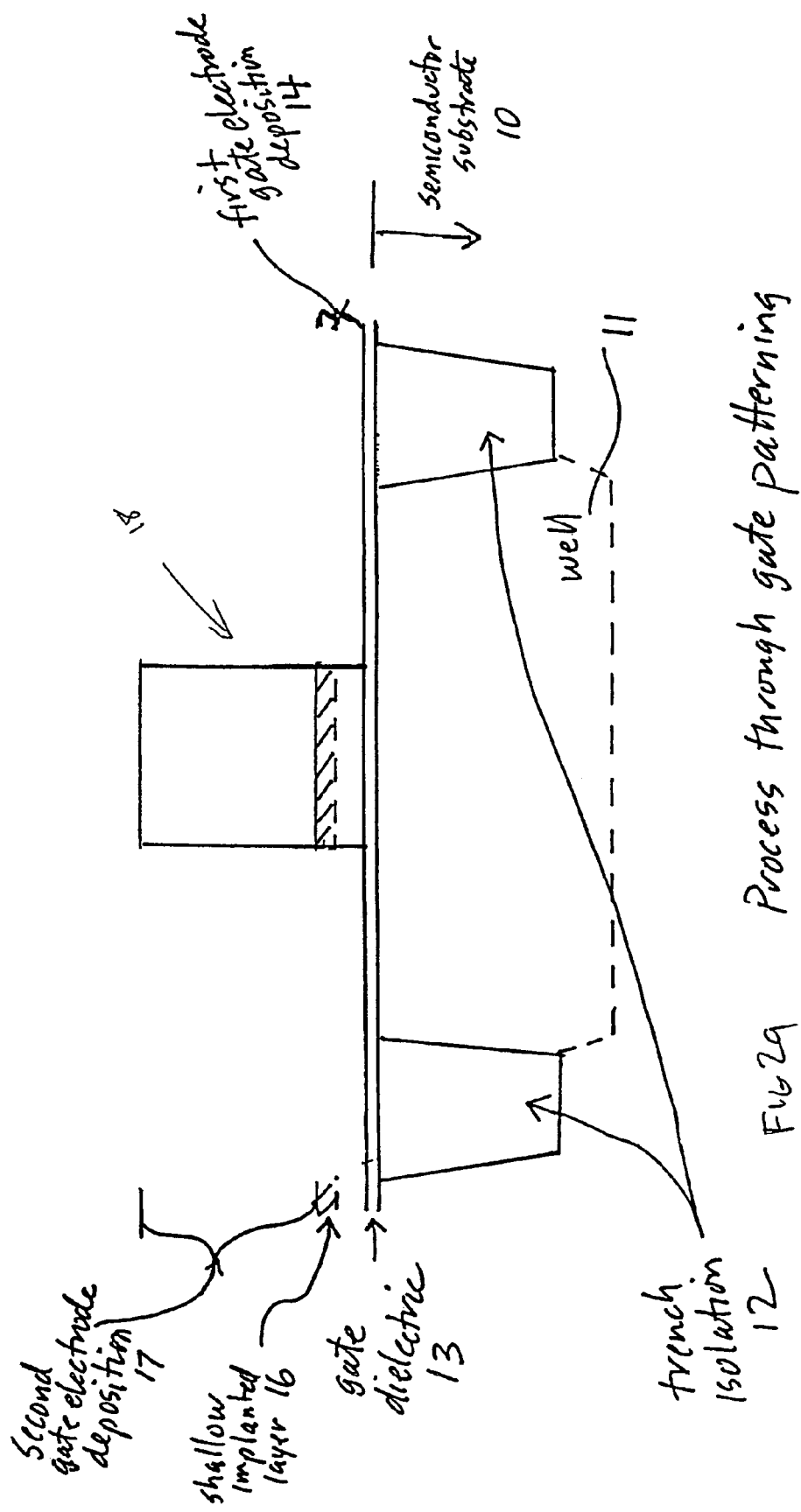
Fig 2g  Process through gate patterning

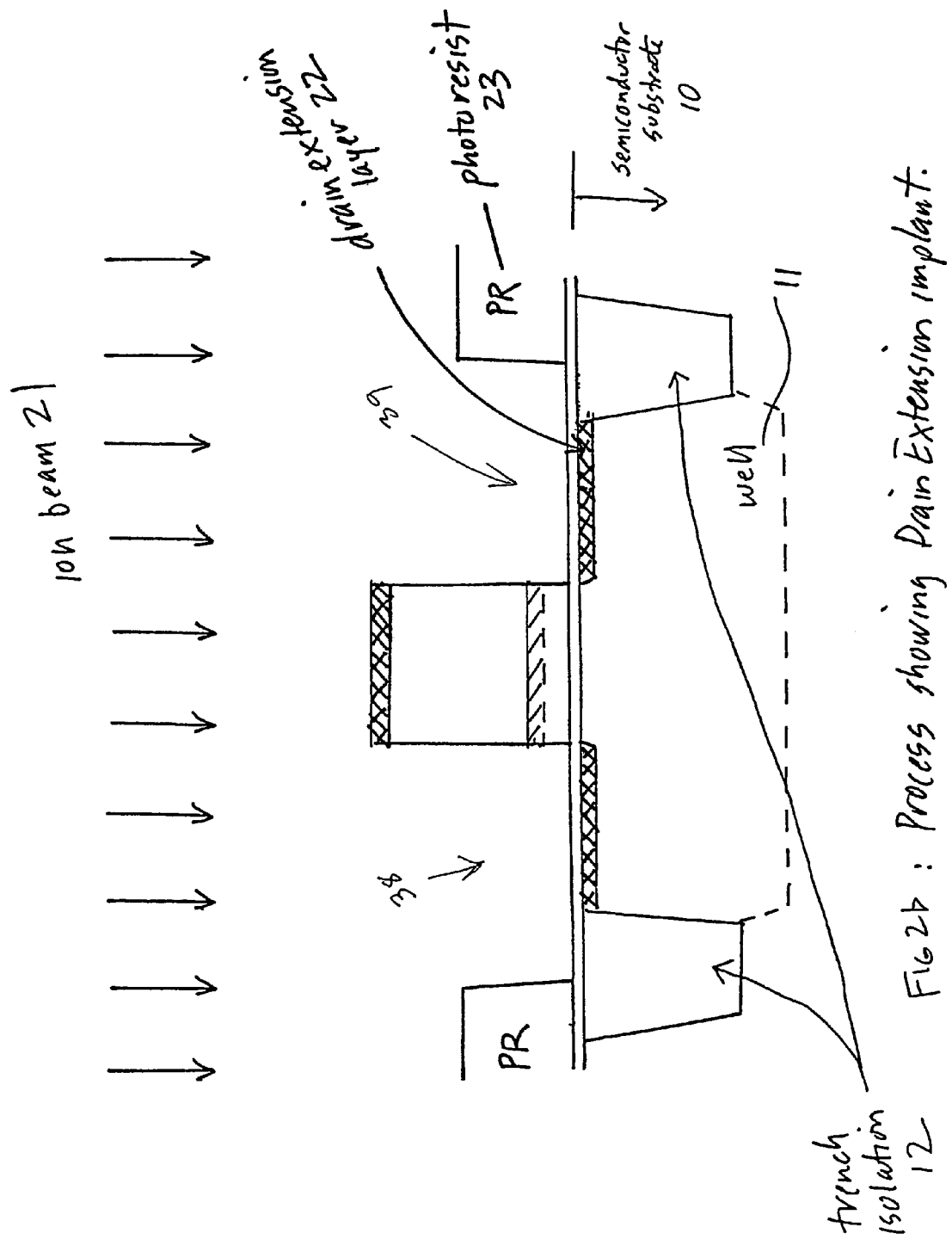
Fig 2b: Process showing Drain Extension implant.

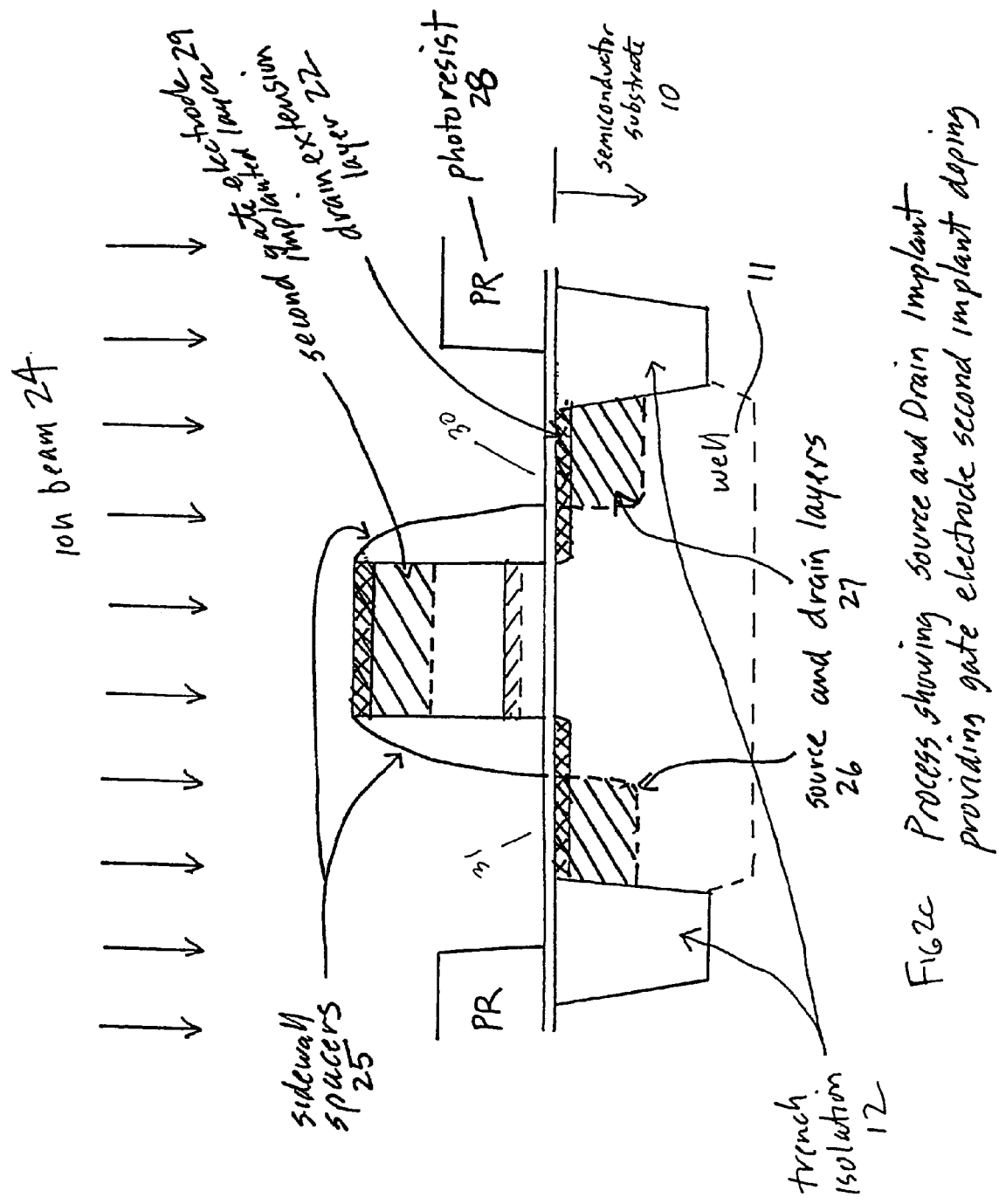
FIG 2c Process showing Source and Drain Implant providing gate electrode second implant doping

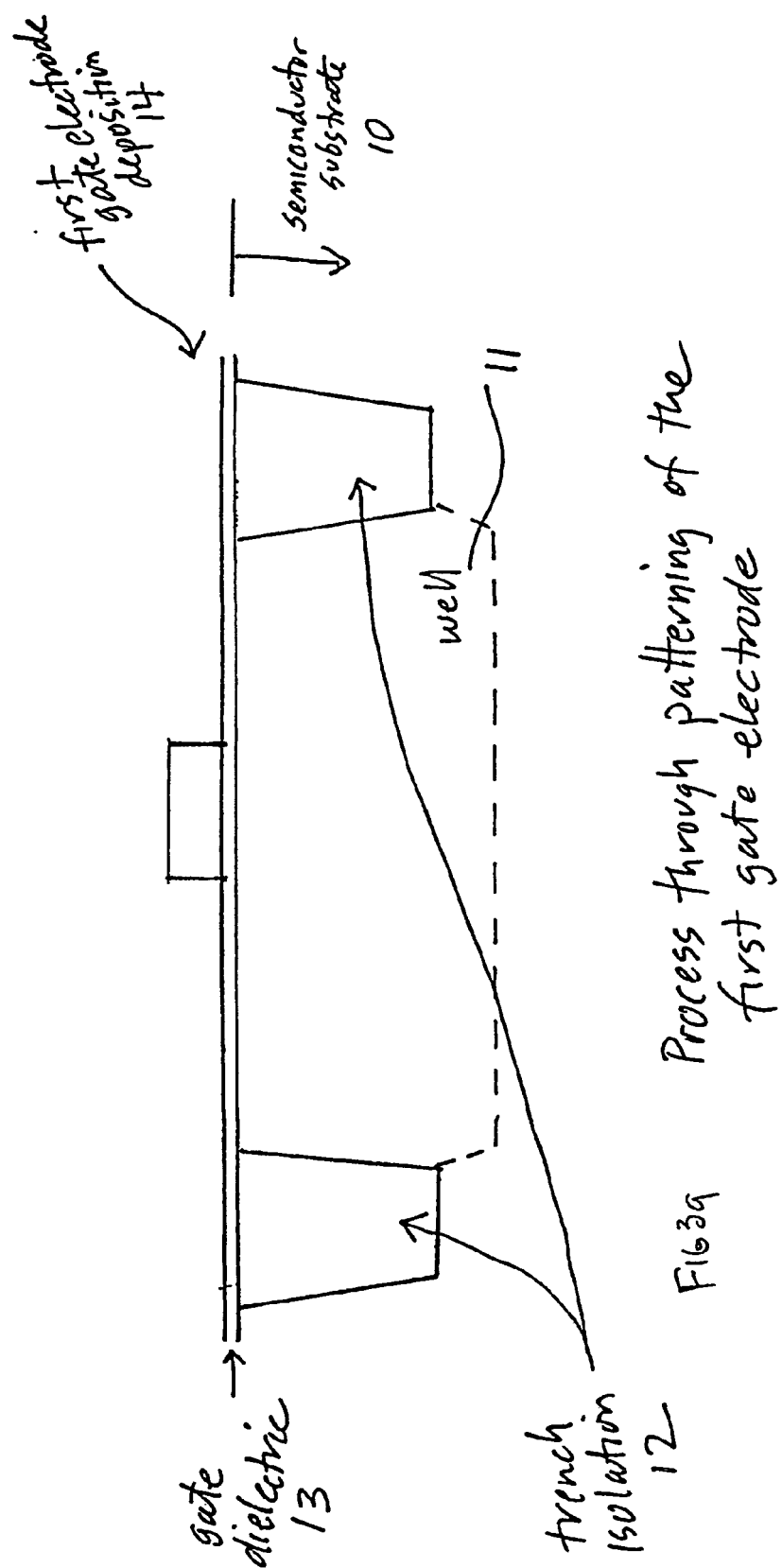

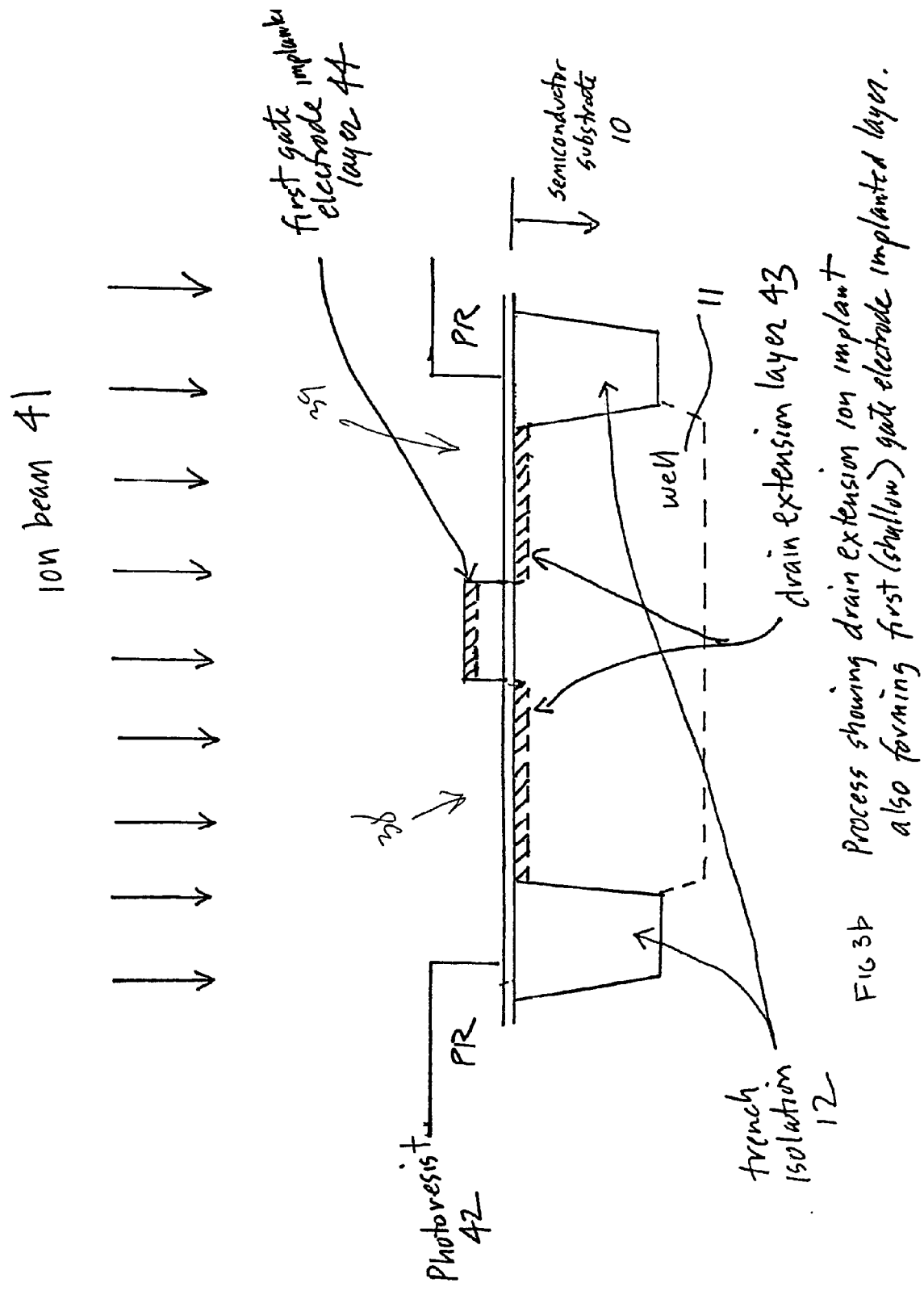

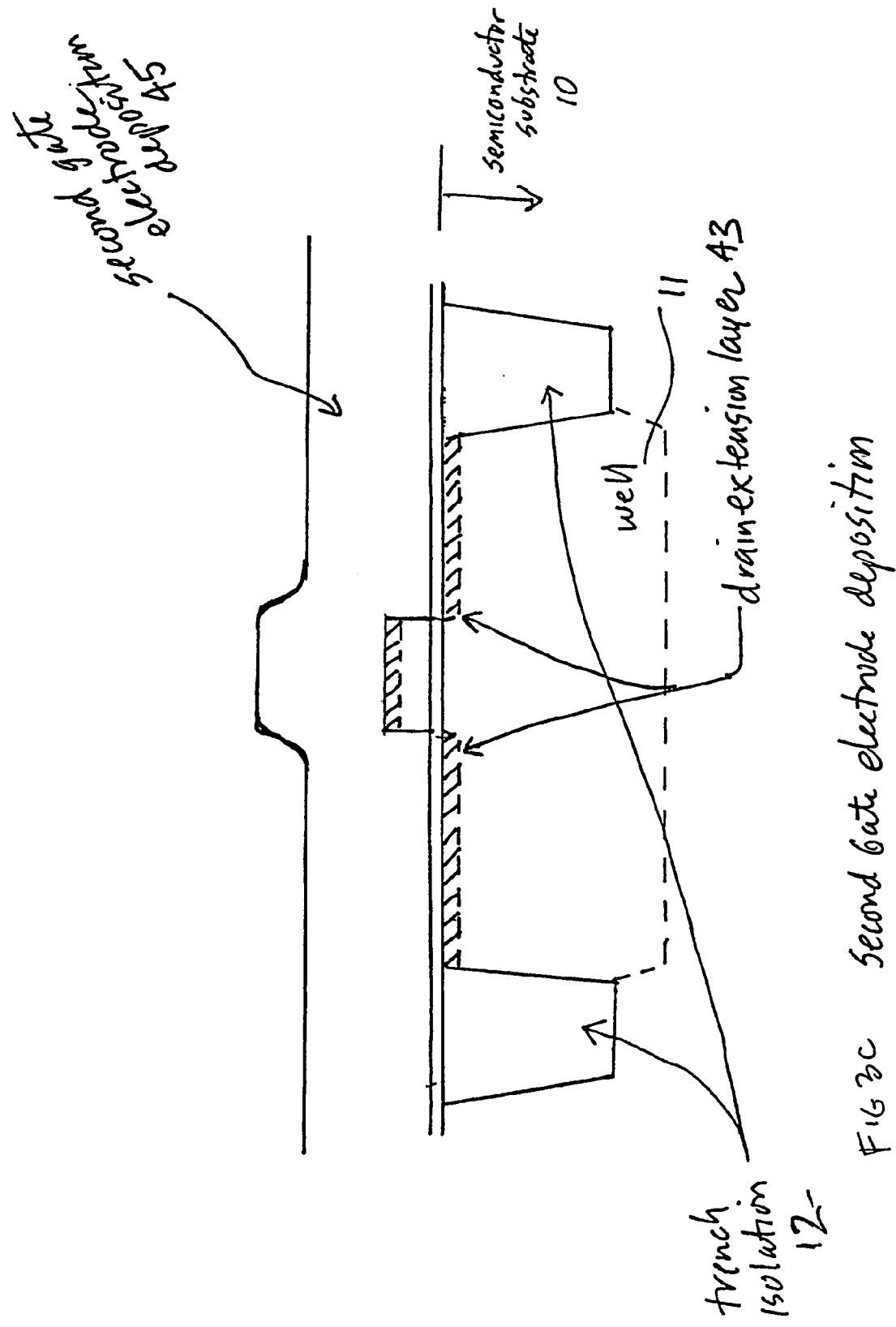
FIG 3c  Second Gate electrode deposition

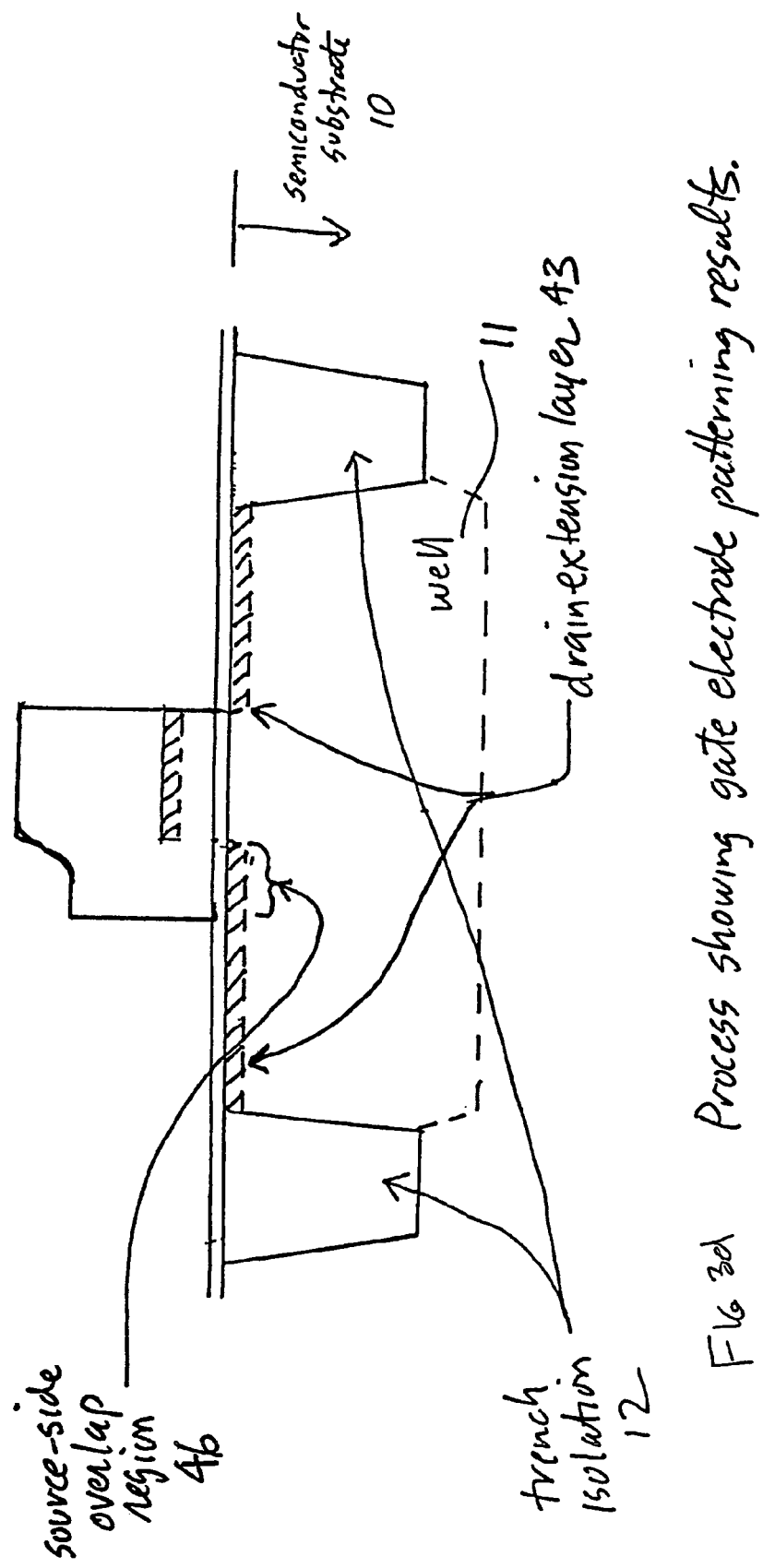
FIG 30d  Process showing gate electrode patterning results.

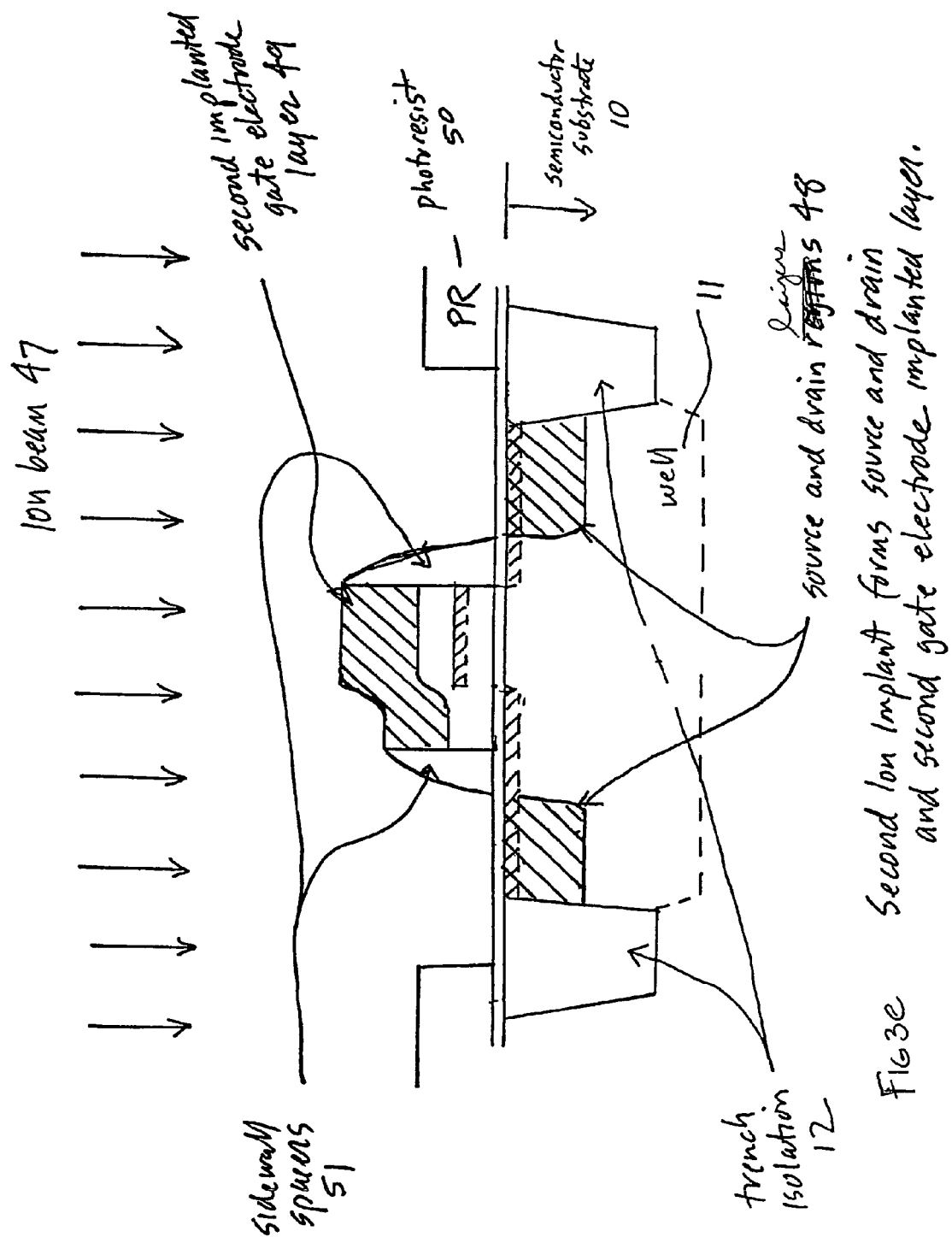

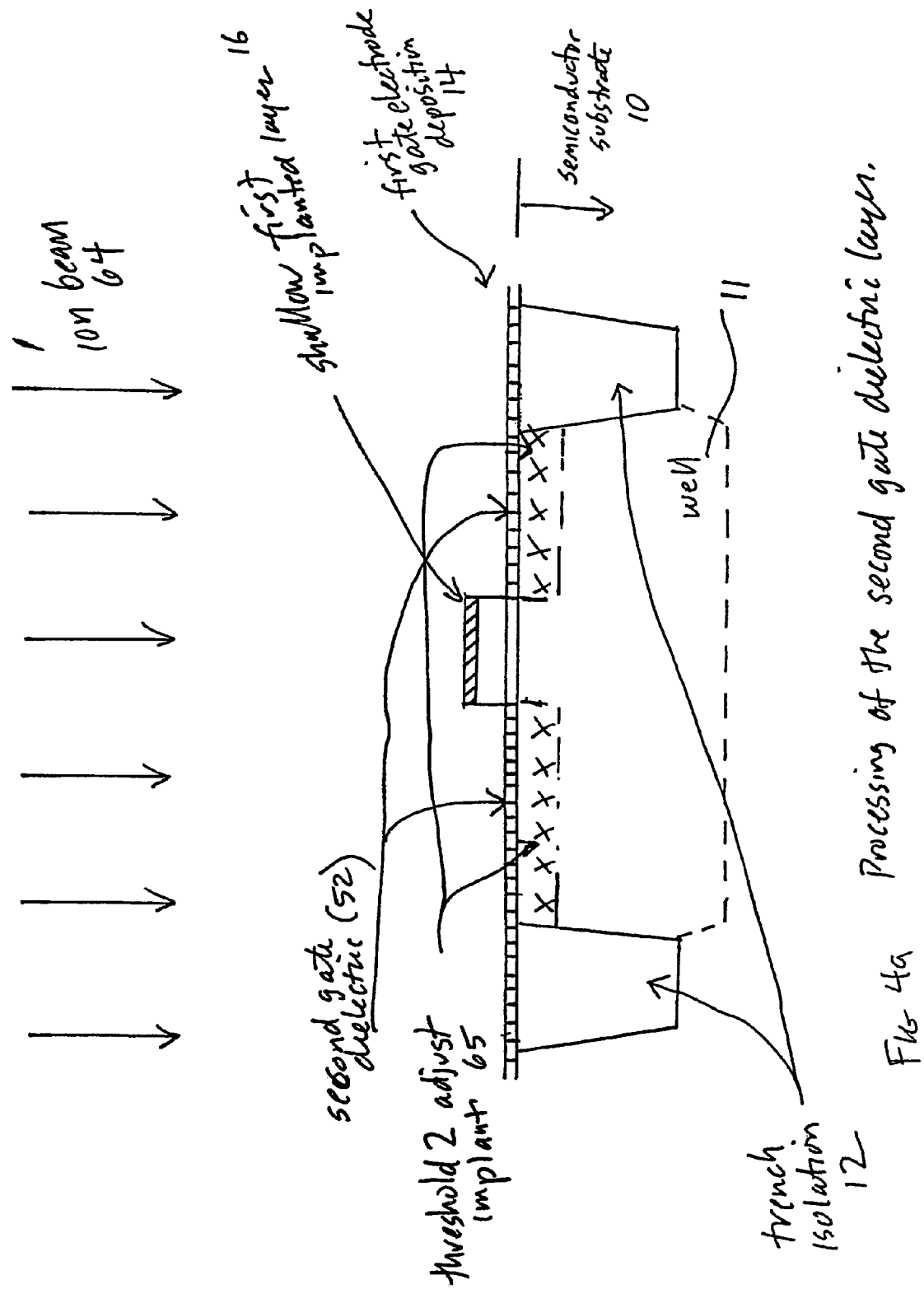

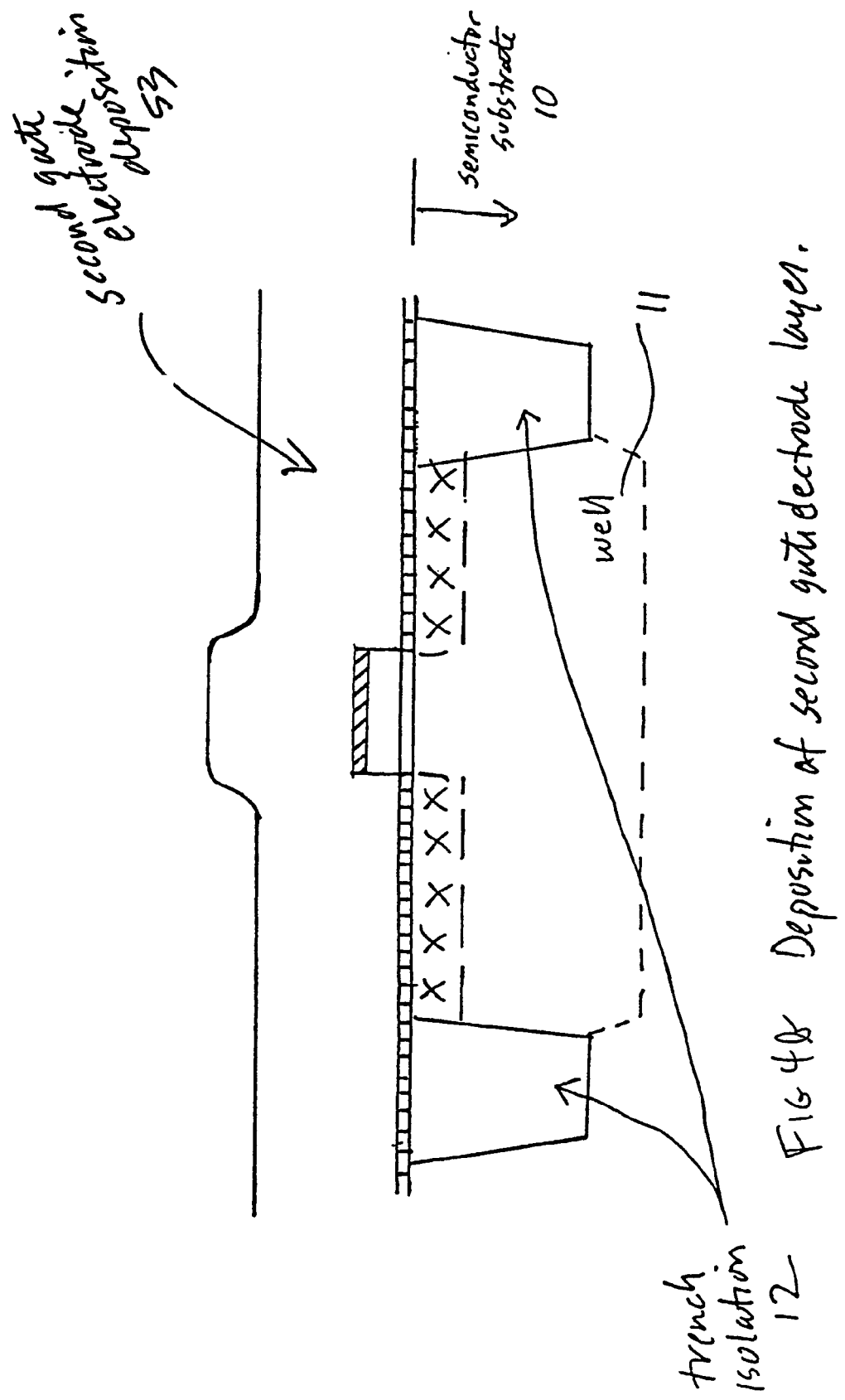

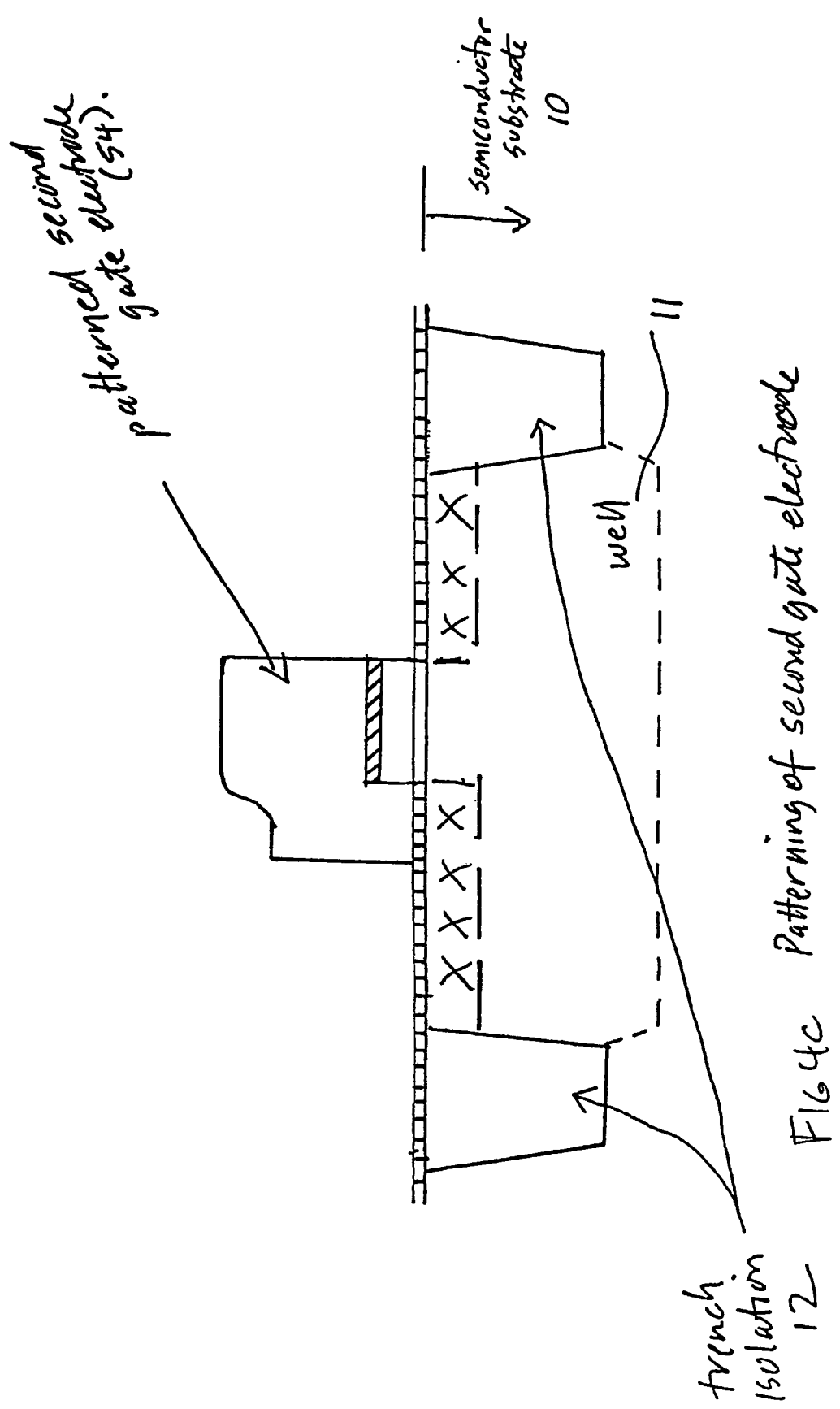
FIG 4c  Patterning of second gate electrode

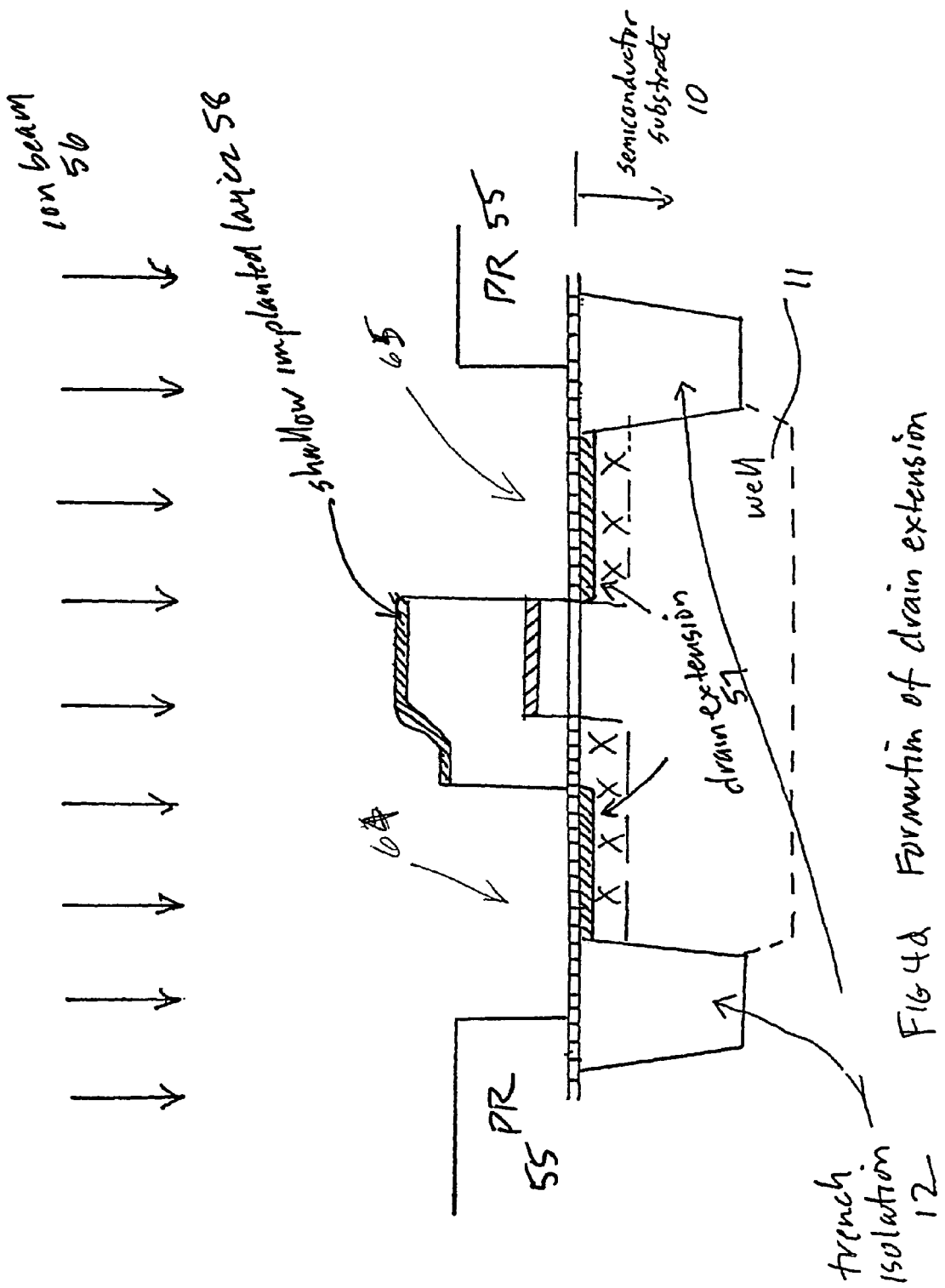
FIG 4d Formation of drain extension

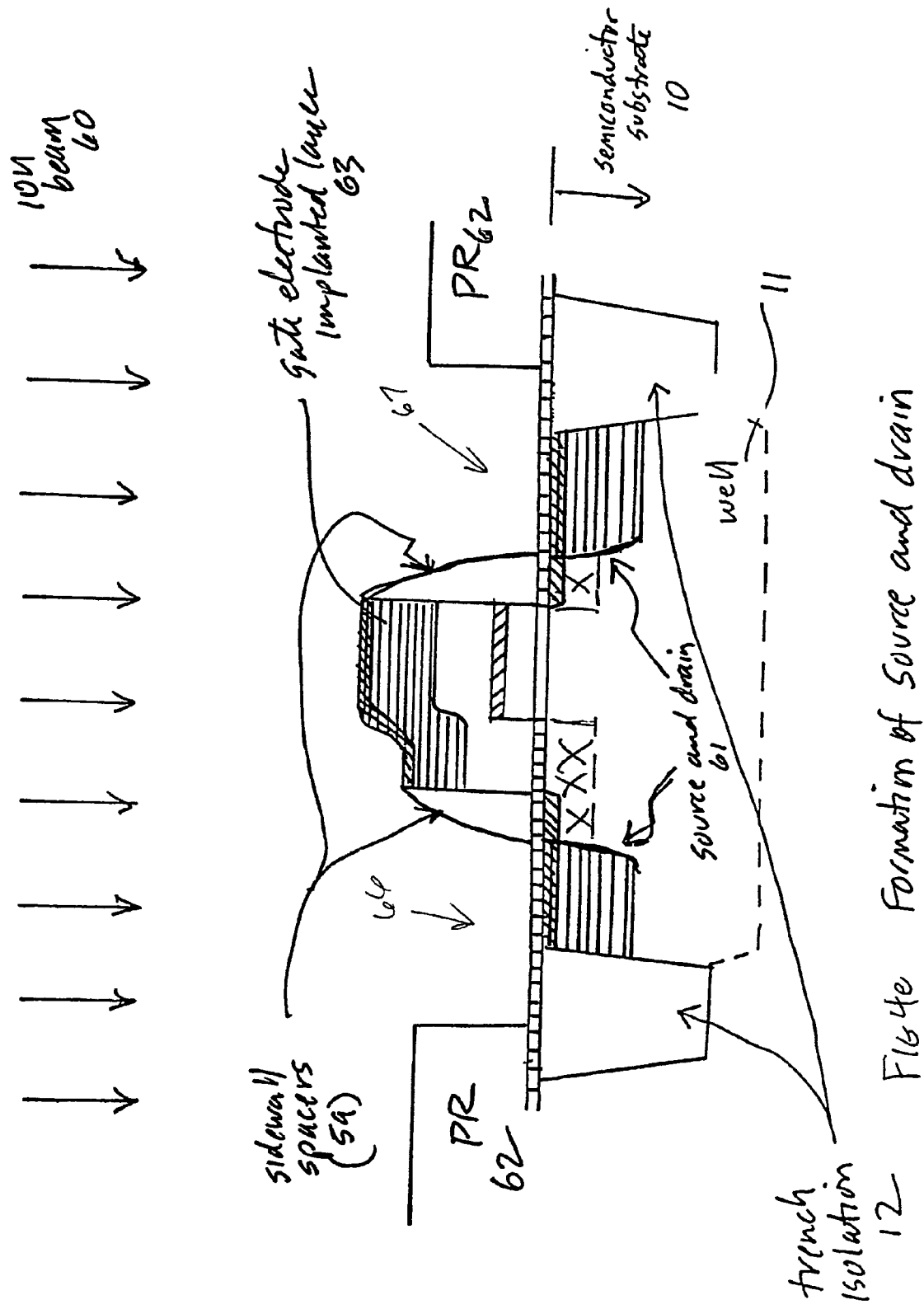
FIG. 4e Formation of Source and drain

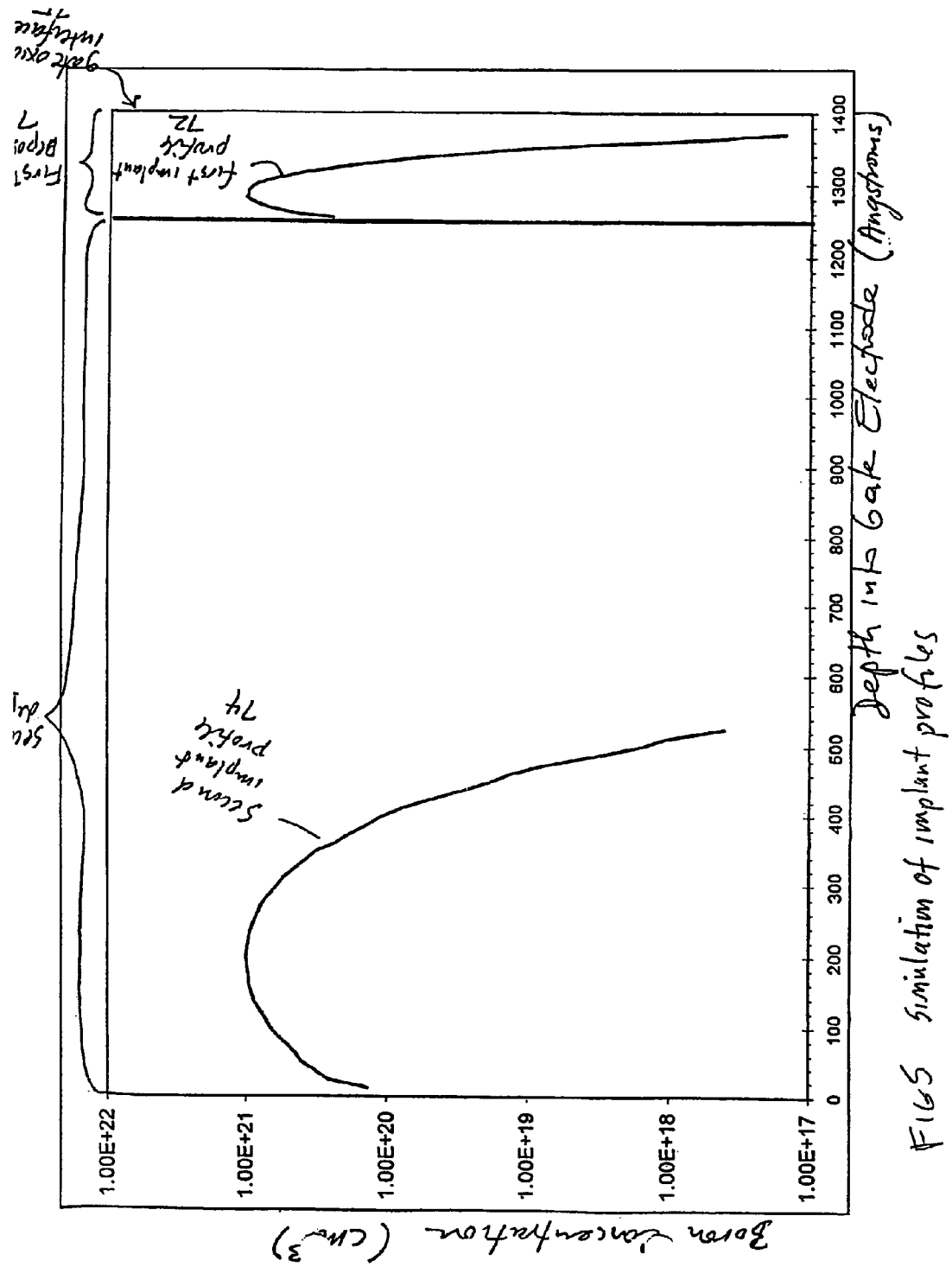
FIG 5 Simulation of implant profiles

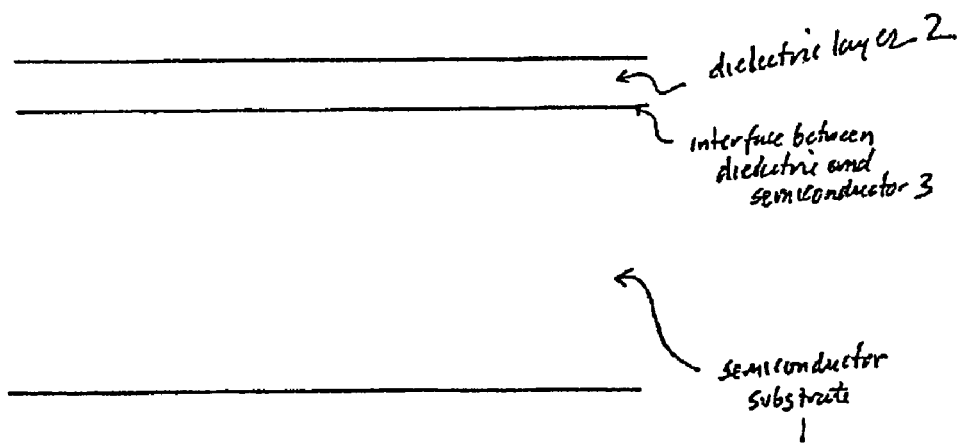
FIG 6 semiconductor substrate with dielectric layer on surface

Ion implant places dopant plus second species into implanted layer contained within dielectric

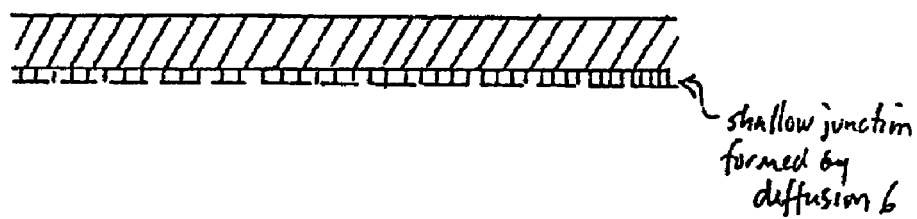
shallow junction formed by diffusion 6
FIG8: After heat treatment, a shallow junction has been formed in the semiconductor substrate.

SEMICONDUCTOR DEVICE AND METHOD OF FABRICATING A SEMICONDUCTOR DEVICE

CROSS REFERENCE TO RELATED APPLICATIONS

This application claims the benefit of and priority to PCT International Application No. PCT/US03/19085, filed on Jun. 18, 2003, which, in turn, claims priority to U.S. Provisional Application No. 60/392,023, and U.S. Provisional Application No. 60/391,802, both filed on Jun. 26, 2002.

BACKGROUND OF THE INVENTION

1. Field of the Invention

This invention relates to semiconductor devices and in particular to the processes used to fabricate them.

2. Description of the Prior Art

The process for fabricating conventional CMOS (Complementary Metal Oxide Semiconductor) semiconductor devices is well known and includes the steps of creating a gate dielectric layer, depositing polysilicon gate electrode material, patterning the polysilicon/dielectric gate stack into the gate electrode, implanting a drain extension implant, creating sidewall insulator structures (spacers), implanting a source/drain implant, and providing a heat treatment to diffuse and electrically activate the implanted layers. The implants can be of n-type or p-type dopants, for the formation of N-channel or P-channel devices respectively.

There are various technical issues related to conventional CMOS processes as technology scaling progresses with regard to the doping of the gate electrode. First, as the gate dielectric thickness is scaled down, the field intensity at the gate electrode/gate dielectric interface increases with the result that the gate electrode experiences depletion of charge starting at the dielectric interface. This condition is undesirable because it has the effect of increasing the effective gate dielectric thickness, and modulating the threshold voltage. Further, there is a competing issue that attempts to increase the doping of the gate electrode at the electrode/dielectric interface which enhances the risk of dopant diffusion through the gate dielectric and into the channel, particularly for boron doped gates. Dopant penetration of the gate dielectric is undesirable because it changes the threshold voltage. The device is sensitive to dopant penetration of the gate dielectric because the doping concentration in the channel region under the gate is low; therefore small amounts of dopant diffusing through the gate dielectric have significant effects.

There are two unit processes involved in the gate doping processes that interact to determine the extent of gate depletion and gate dielectric penetration. The first is the ion implant which provides the dopant atoms, and the second is the heat treatment, or annealing, needed to activate the implanted dopant, and which also diffuses the dopant through the gate material. The ion implant energy is chosen to be low, even though this compromises productivity, to ensure that no dopant is implanted through the gate oxide, since the underlying channel region is doped with a low concentration. This requires that the dopant be diffused through the gate layer to provide dopant at the gate electrode/gate dielectric interface where it is needed to prevent gate depletion. However, the gate material is usually polysilicon, which has very nonuniform diffusion characteristics. As such, there is very fast diffusion down to the grain boundaries in the polysilicon, so some dopant reaches the gate electrode/gate dielectric interface quickly, yet most of the dopant still needs to diffuse to fully dope the polysilicon grains and achieve high conductivity. The grain boundary dopant at the gate electrode/gate dielectric interface is then a risk for gate dielectric penetration as the heat treatment continues. This risk is increased as the heat treatment goes to higher temperatures and longer times. There are practical limits to the reduction of time/temperature for the gate electrode anneal, due to the need to diffuse the dopant to the gate electrode/gate dielectric interface and the need to electrically activate the implanted dopant, for example, as disclosed in M. Kase, et al. "FEOL Technologies for Fabricating High Performance Logic and System LSI of 100 nm node, 12th International Conference on Ion Implantation Technology Proceedings, 1998, p.91.

The technologies that have been proposed to address these issues include oxynitride gate dielectric, SiGe gate electrode material, and metal gate electrode materials. The oxynitride gate dielectric is useful for the reduction of the boron penetration through the gate oxide, but does not help with the gate depletion effect. The SiGe gate material also reduces boron diffusion and thus helps with gate penetration while increasing the effective doping concentration, which also helps with the gate depletion. The problem is that the SiGe gate material degrades the NMOS characteristics and thus requires complex selective technologies to achieve a full CMOS solution. The metal gate approach solves the boron penetration problem (no boron to diffuse) and the gate depletion issue (near infinite charge concentration) but makes setting the threshold voltage for NMOS and PMOS simultaneously very difficult. The metal gate approach also has significant challenges in process integration; since the metal layers are not physically stable at the high temperatures of the heat treatments required for implant activation, such as required by the source and drain regions.

The conventional device faces other limiting factors as technology scales. With continued scaling, for example <0.1 um technology, the conventional device suffers from the need to provide sufficient gate overlap of the drain extension region to ensure high performance operation. In particular, the extrinsic series resistance becomes a limiting factor as the overlap regions are scaled. A recent analysis, as reported by Ghani et al, *Symposium VLSI Technology*, pages 17-18, 2001, has shown that an asymmetric structure has the potential to allow further scaling while maintaining high performance device characteristics. However, the process used by Ghani, et al in the demonstration devices is very constraining relative to large-scale production requirements: the structure requires a tilt implant selectively on the source side and not the drain side. To manufacture devices with such a structure would require limiting the layout so that all sources are to one side and all drains to the other, making the circuit very large.

There is also a trend to form shallow semiconductor junctions. The requirement for shallow junctions is a direct result of the continued scaling of semiconductor technology wherein there is a constant progression to smaller devices. As the devices are made smaller, there are many features of the fabrication process that must be modified, or "scaled" in order to maintain proper functionality of the transistor and other circuit elements required. The impact on junction formation technology is that it is expected that the junction depth would scale as technology scales, that is, the junctions become shallower as the gate length becomes shorter. In this way, the transistor functionality is preserved.

There are difficulties with continuing the historical methods of scaling the junction depth. In particular, the conventional method of formation of such junctions is the use of ion implantation to introduce the dopant into the semiconductor substrate, followed by a heat treatment step to make the dopant atoms electrically active. To achieve shallower junctions, the ion implantation must be performed with lower energy, so that the atoms do not penetrate into the semiconductor substrate as far. In general, shallow junctions require an ion implant energy of less than 5 keV, while ultra-shallow junctions require ion implant energy of less than 1 keV (for boron implants). These implants have low productivity on a conventional implanter because they are in the regime where Child's Law applies; implants with energy of less than 10 keV. In this regime, the implanter's beam current is limited by space charge effects, with a maximum current that is proportional to the extraction voltage to the 3/2 power. The conventional means of increasing the productivity in this regime is to implement an acceleration/deceleration configuration for the implanter: the beam is extracted at high energy to avoid the space charge limit imposed by Childs Law, and then decelerated before the wafers to implant with the correct energy. While this method is able to increase productivity by around 2×, the deceleration beam has issues with energetic contamination and nonuniformity of implant results.

There are further issues with the conventional implant process for the formation of ultrashallow junctions in that the implant creates defect structures within the silicon implanted layer that pose more of an issue as the energy is reduced and the layer becomes shallower. First, the density of created defects increases quickly because the implanted volume of the substrate material is reduced as the implant is made shallow. Since the doses are either the same or increasing, the reduction of implant depth corresponds to an increase in both the density of implanted dopant and the implant defects. As the defect density increases, the probability of interaction increases dramatically, with the problem that combinations of defects make more complex defect structures which are very difficult to anneal. It may be noted that the high density of implanted dopant, boron for example, also increases the probability that dopant complex structures will form. This is particularly an issue when the dopant concentration exceeds the solid solubility, since the supersaturated dopant tends to precipitate into undesirable structures. For example, supersaturated boron tends to precipitate into silicon boride (SiB4), a structure which binds the boron into electrically inactive position, rendering that component of the boron implant completely ineffective. As the energy is reduced, more of the implanted dose resides in a region where the concentration is above the solubility, so the effectiveness of the implant decreases with energy.

The conventional process also places extreme constraints on the heat treatment, or anneal, used to make the implanted dopant electrically active. There is a strong conflict between the need to heat the substrate to high temperatures to effectively activate the implanted dopant versus the need to limit the temperature and time of the anneal to prevent diffusion. This conflict has lead to the development of a process called the spike anneal, where the temperature is ramped quickly to a peak temperature, and then immediately ramped down, such that the residence time at the maximum temperature approaches zero. Such an anneal is necessary for the formation of ultrashallow boron junctions to minimize the diffusion of boron.

It has been proposed to address some of these issues with the formation of ultrashallow junctions by implanting into a surface oxide layer and then diffusing through the oxide into the substrate to form the junction, for example, as discussed in Schmitz, et al, "Ultra-Shallow Junction Formation by Outdiffusion from Implanted Oxide" *IEEE-IEDM* '98, p1009; and Schmitz, et al, "Shallow Junction Fabrication by Rapid Thermal Outdiffusion from Implanted Oxides" *Proceedings of Advances in Rapid Thermal Processing*, Electrochemical Society, Seattle Wash., 1999, p.187. This approach has the advantage of reducing or eliminating the defect formation in the semiconductor substrate by placing most of the implant damage into the oxide layer. The method also relaxes the constraints on annealing because most of the diffusion is now through the oxide layer. The method has the disadvantage, though, that diffusion through oxide is generally slower than through silicon, for example, as discussed in Fair, "Physical Models of Boron Diffusion in Ultrathin Gate Oxides" J. Electrochem. Soc, 144, 1997, p.708-717.

A further issue with the conventional process is the difficulty in avoiding implanting into an oxide while attempting to form an ultrashallow junction, for example, as discussed in Krull, et al, "The importance of the native oxide for sub-keV ion implants," *Proc. 12th International Conference on Ion Implant Technology*-1998, p1113, 1999. As technology scales and the implant energy is reduced, it becomes increasingly difficult to remove the surface oxide well enough that it does not interfere with the ion implant process. As discussed by Krull, et al, even a native oxide (oxide that forms on a silicon wafer just by exposure to air at room temperature) is thick enough that a boron implant with energy of 250 eV places most of the atoms into the oxide (1.5 mm) rather than into the silicon as intended. Since the native oxide forms at room temperature in air, extreme measures are required to implant into truly bare substrates, such as an in-situ oxide strip inside the vacuum system of the ion implanter. There are no production implanters with such capability. Absent the ability to implant into truly bare substrates, the production solution must involve controlling the thickness of oxide present and implanting into that oxide. Such a process will be required to provide production level repeatability.

SUMMARY OF THE INVENTION

The present invention uses a two-deposition gate formation process to allow alternative process conditions, which address the issues of gate depletion and dopant penetration of the gate dielectric observed in conventional technologies. In particular, the present invention relates to the formation of a gate electrode by a combination of two-deposition-plus-implant sequences. The first deposition is thin and its corresponding implant is very shallow, to directly place a maximally effective dose as close to the gate electrode/gate dielectric interface as possible. The emergence of cluster ion implants which enable high dose, ultra low effective-energy implant processes, eliminates the previous constraints on doping very thin layers. The second deposition completes the gate electrode to a conventional thickness and allows the independent selection of the ion implant and heat treatments for the second deposition.

It may be noted that the advent of spike annealing further enables the formation of very shallow, highly activated dopant layers. A spike anneal is a rapid thermal process or heat treatment in which the time at the highest temperature approaches zero: the temperature is ramped up very quickly and immediately ramped down as quickly as possible. In the present invention, the formation of the shallow doped layer at the gate electrode/gate dielectric interface eliminates one of the constraints on the implant and heat treatment normally used for single gate processes: since there is no longer a need to diffuse the dopant through the gate electrode layer to the gate dielectric interface to combat gate depletion, a spike anneal can be used, further reducing the risk of dopant penetration of the gate dielectric.

Further benefits of this two-deposition gate formation process can be realized when two gate-patterning steps are included. In particular, one benefit of utilizing two patterning steps is that the drain extension implant can be used for both the first level gate doping step and the drain extension implant, eliminating one shallow implant from the process. Next, the use of two patterning steps allows the freedom to choose to offset the second pattern towards the source side of the gate. This would create an asymmetric source/drain transistor with much larger overlap of the drain extension region on the source side than the drain side. This is an effective means of creating the kind of transistor behavior described by Ghani, et al, while avoiding other layout and process constraints.

Another aspect of the invention relates to a method of fabricating an ultrashallow semiconductor junction by ion implantation of a dopant species into a dielectric layer on the surface of a semiconductor substrate and diffusing the dopant through the dielectric layer and into the semiconductor substrate, thereby creating a shallow semiconductor junction. The method is further comprised of implanting an additional species, or more than one additional species, where the action of the additional species is to enhance the diffusion of the dopant through the dielectric layer, thereby making the process more effective. One example of such a process is the implantation of a boron/hydrogen cluster ion into a silicon dioxide layer atop a silicon wafer. In this case, the hydrogen is known as set forth in the Fair reference, supra, to enhance the diffusion of boron in silicon dioxide, allowing management of the annealing process used to enable diffusion. This enhancement of the diffusion rate in oxide allows the relaxation of other process constraints, particularly on the time and temperature of the annealing treatment.

DESCRIPTION OF THE DRAWINGS

These and other advantages of the present invention will be readily understood with reference to the following specification and attached drawings wherein:

FIGS. 1a-1d are process flow diagrams showing a two-deposition gate formation process in accordance with the present invention.

FIGS. 2a-2c are process flow diagrams showing the two-deposition gate formation process achieving self-aligned drain extension and source and drain regions in accordance with the present invention.

FIGS. 3a-3e are process flow diagrams showing the two-deposition gate formation process with two gate patterning steps to form an asymmetric overlap transistor structure in accordance with the present invention.

FIGS. 4a-4e are process flow diagrams showing the process sequence for formation of the notched transistor structure in accordance with the present invention.

FIG. 5 is a graphical illustration of boron concentration as a function of the gate electrode depth for the two step gate formation process in accordance with the present invention.

FIG. 6 is a diagram of semiconductor substrate with surface dielectric layer.

FIG. 8 is a diagram showing substrate after heat treatment, where dopant has diffused out of dielectric layer and formed a shallow junction in accordance with the embodiment of the invention illustrated in FIG. 7.

DETAILED DESCRIPTION

The present invention relates to a method for forming the gate electrode of an MOS transistor with a two-deposition process, as a means of addressing the issues of gate depletion and boron penetration of the gate dielectric, without requiring new materials. The present invention also relates to a method for forming an ultrashallow junction in a semiconductor substance.

Formation of Gate Electrode

As mentioned above, one aspect of the invention relates to the formation of a gate electrode of a MOS transistor by way of a two step deposition process. In the two-deposition process, the first step is the deposition of a thin layer of electrode material, followed by a shallow ion implantation to provide a high concentration of dopant near the gate electrode/gate dielectric interface. The second step is also a gate layer deposition, followed by ion implantation, such that the total thickness of the two layers is comparable to a conventional single layer gate electrode structure.

In the following description of embodiments of the invention, certain specific details are discussed. It should be understood these details are examples only. Specifically, the examples are intended to illustrate a PMOS (P-channel Metal Oxide Semiconductor) transistor of the 0.13 um technology node. However, the principles of the present invention are clearly applicable to other applications, including application to NMOS transistors.

Figure 1D:
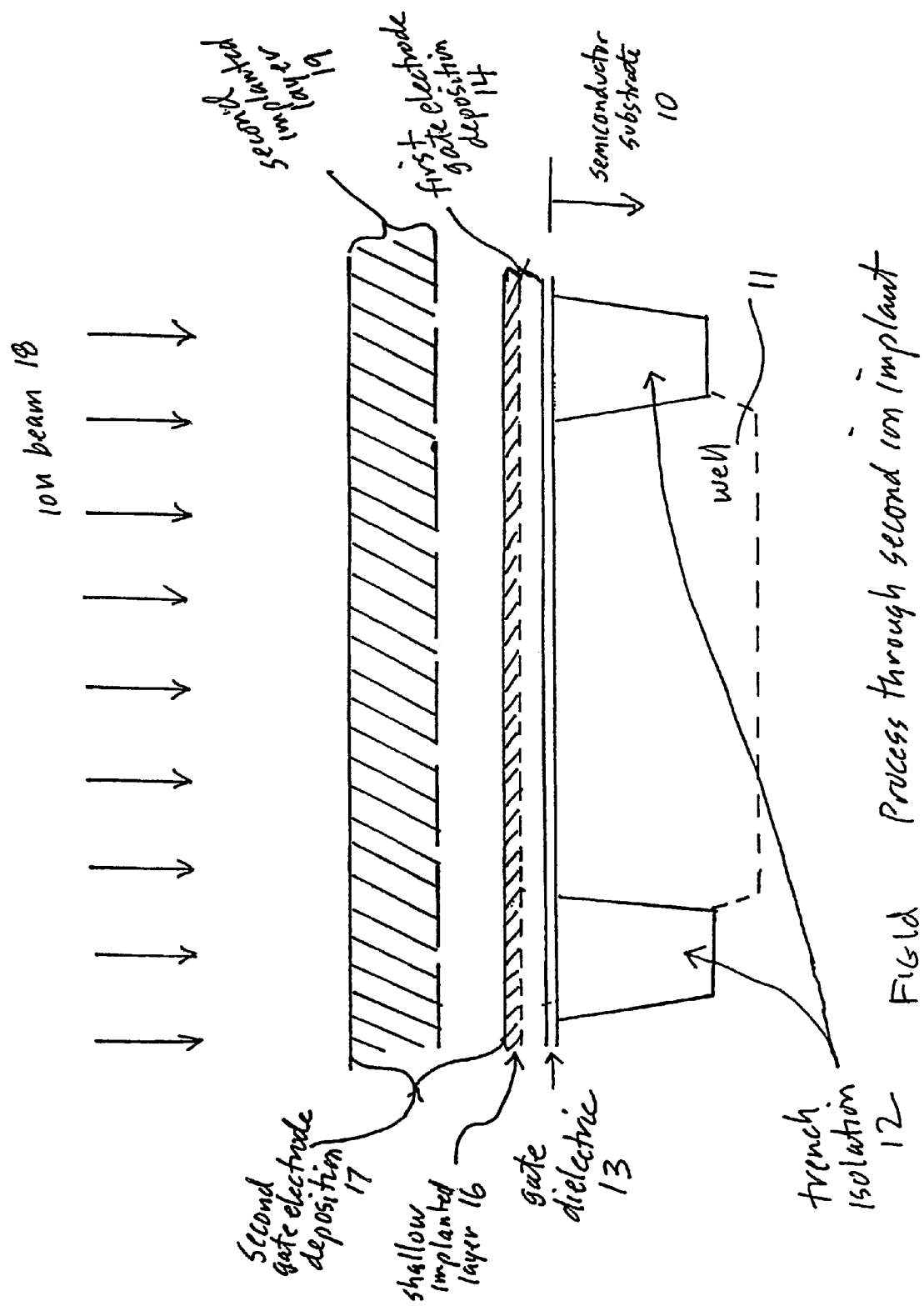

One embodiment of the invention relating to the formation of a gate electrode is shown in FIGS. 1a-1d. In particular, FIG. 1a shows a semiconductor substrate (10) that has been processed by conventional CMOS processing steps through the steps of well formation (11), trench isolation (12) and a gate dielectric formation (13). The well structure is, for example, a doped n-type for the PMOS transistor. The gate dielectric thickness is around 2 nm for the 0.13 um technology node. The first gate deposition (14) with a thickness of 15-20 nanometer (nm), for example, is formed directly on top of the gate dielectric layer (13). Typically this deposition (14) is either a layer of amorphous silicon or polycrystalline silicon (polysilicon). The interface (9) between the gate dielectric and the first electrode layer (14) of the gate electrode is where gate depletion occurs in the conventional device.

FIG. 1b shows the next step of the process, which is the shallow ion implant to dope the first gate electrode layer. The requirements for this implant are around 500 eV boron to a dose of around $1 \times 10^{15}$ $cm^{-2}$. An alternative process is a decaborane implant at 5.5 keV to a dose of $1 \times 10^{14}$ $cm^{-2}$, or other process-equivalent implant step. It may be noted that the energy of the implant must be low so that the dopant penetration is shallow; in particular, none of the implanted dose (<0.1%) should go through the deposited layer and gate dielectric, since the channel region must be doped with a low concentration to set the threshold voltage correctly. It may be noted that this constraint is severe for a conventional implant process because the productivity is challenged by the low energy required and the energy contamination that results from deceleration of the ion beam is a risk for penetration through the gate stack and into the channel.

The processing continues as shown in FIG. 1c, which illustrates the second deposition layer (17) directly deposited over the first deposition layer (14). Since together the first and second deposition layers 14 and 17 respectively, form the gate electrode, no intervening layers are required. The second deposition layer (17) may be either amorphous silicon or polysilicon. It is noted that an amorphous silicon deposition offers some advantages in terms of layer smoothness and channeling avoidance but the amorphous silicon does convert to polysilicon later in the process flow, during a heat treatment. The thickness of the second deposition layer (17) may be around 130 nm, for example, so that the total of first and second deposition is around 150 nm, a full thickness gate electrode.

FIG. 1d illustrates a second ion implantation or doping step, for example, an ion implant of boron, boron molecules or boron clusters with the boron equivalent energy of around 2 keV and a high dose of around $5\times10^{15}$ cm$^{-2}$. From this point, the conventional CMOS process continues with gate patterning, spacer formation, source and drain formation, etc.

One embodiment of the present invention includes the step of patterning the gate stack (18) (gate oxide/first electrode layer/second electrode layer) prior to the second implantation. One advantage of this embodiment is self-alignment between the drain extension and source/drain regions and the patterned gate stack (18). This process sequence is shown in FIGS. 2a-2c. In particular, FIG. 2a shows the substrate from the previous process sequence after the processing as illustrated in FIG. 1c and patterning of the gate stack 18, for example, by conventional photolithography. For a 0.13 um technology node, the gate length is in the range of 60-120 nm. FIG. 2b shows the process continuing through the step of drain extension implant. First, a photoresist (PR) layer (23) is applied and patterned such that PMOS areas are exposed (i.e. drain extension regions 38 and 39). For the drain extension implant, the ion beam (21) is a boron implant of energy around 500 eV and dose around $5\times10^{14}$ cm$^{-2}$. A boron cluster implant or molecular implant, for example, decaborane, as disclosed in commonly owned U.S. Pat. No. 6,452,338 with process equivalent conditions could be used. The penetration of this implant into the exposed substrate areas forms the drain extension region (22) as shown in FIG. 2c and may also form an implanted layer at the surface of the gate electrode (the gate electrode surface may be protected, if the implanted region is not desired). As shown in FIG. 2b, the inside edge of the drain extension 22 is aligned with the gate stack edge, thus resulting in self-alignment. The PR layer (23) is removed by conventional techniques, and insulator spacers (25) are formed on the sidewalls of the gate stack (18) by way of another photoresist layer (28) that is applied and patterned so that the PMOS device areas are exposed to define drain and source regions 30 and 31, respectively. The second ion implantation step is now performed to create a deep source (26) and drain (27) layers and simultaneously provide the dopant for the full gate electrode (29). The process conditions for the second implant are an energy of around 2 keV and dose of $5\times10^{15}$ cm$^{-2}$ for boron, with process-equivalent conditions for boron cluster ion implants. The second photoresist layer (28) is then removed and conventional CMOS processing is continued if desired including interlevel dielectric deposition, contact formation, metallization, etc.

An additional aspect of the present invention includes the introduction of an additional gate-patterning step after the first set of deposition/implant processes. In this embodiment of the invention, there are two gate-patterning steps required, since the second electrode deposition layer will also need to be patterned into the gate electrode. It is expected that a two gate-patterning approach is only used when an asymmetric transistor structure is desired because of the difficulty in overlaying the two gate patterns. With two gate-patterning steps, the asymmetry can be designed into the two gate patterns, providing control over the asymmetric properties. Two asymmetric structures will be discussed: the asymmetric overlap structure and the notched gate structure.

More particularly, an asymmetric overlap transistor can be formed via the two gate-patterning process sequence. One aspect of this embodiment of the invention is that the electrode implant step can be used to form the drain extension layer, since the implant requirements are the similar. An additional aspect of this embodiment is the ability to form the asymmetric overlap transistor structure by offsetting the two gate patterns. This process sequence is shown in FIGS. 3a-3e. In FIG. 3a, the substrate from FIG. 1a has been processed through a gate-patterning step. For the 0.13 um technology node, the gate length for this pattern is around 50-80 nm. At this point, a photoresist layer (42) is applied and patterned, as shown in FIG. 3b, to expose drain extension regions 38 and 39 of the dielectric layer 13. A shallow ion implant step is provided, such that the drain extension (43) is created in the exposed source and drain regions and the exposed surface of the first gate electrode becomes doped (44). The implant conditions for this implant may be a decaborane implant of 5.5 keV to a dose of $0.5-1\times10^{14}$ cm$^{-2}$, or process equivalent implant by boron or boron cluster, such as decaborane. At this point, the photoresist layer (42) is removed by conventional techniques, and the second gate deposition (45) is provided, creating the structure shown in FIG. 3c. Next, the gate electrode layer is patterned, with the pattern being larger and having an offset to the first gate pattern layer. The resulting gate electrode stack is shown in FIG. 3d. The overlap of the second gate layer beyond the first gate layer may be constrained to the source side of the transistor as shown (46). In this way, very small transistors can be formed without degradation of the drain saturation current, IDSAT, as discussed by Ghani, et al., supra. The process continues, as shown in FIG. 3e, with the formation of gate sidewall spacers (51) and the application and patterning of a photoresist layer (50) to expose only the PMOS transistors and thereby define drain and source regions 38 and 39 of said dielectric layer 13. Then, the second ion implant is performed with ion beam (47) conditions of 2 keV, $5\times10^{15}$ cm$^{-2}$ boron, or a process-equivalent cluster ion implant. FIG. 3e shows the formation of the source and drain regions (48) and the second ion implant layer in the gate electrode, by the penetration of this ion implant. At this point, the asymmetric overlap transistor structure is formed and the substrate would continue through a conventional CMOS fabrication sequence, through interlevel dielectric deposition, contact formation, metallization, etc. It may be noted that other variations of the asymmetric overlap transistor can be formed by variation of this method.

Another aspect of the present invention relates to the formation of a notched gate transistor structure by application of this method, such as shown in FIGS. 4a-4e. This process sequence starts with a substrate process through the first gate deposition and first gate implant, as illustrated in FIG. 1b. At this point, the first gate electrode layer is patterned. The next step in the process is to provide the second gate dielectric (52) at the exposed semiconductor surface outside of the patterned gate stack. The second gate dielectric is different from the first gate dielectric, and it's processing might include any of a variety of gate dielectric processing steps including: implantation of a species such as nitrogen into the existing gate dielectric, chemical treatment of the existing dielectric, such as exposure to ammonia at high temperatures, clearing the existing dielectric and regrowth of a different gate dielectric, such as a different thickness of silicon dioxide or an oxynitride dielectric with a different nitrogen content, deposition of an additional layer of gate dielectric, such as silicon nitride or hafnium or zirconium oxide or silicate, or a combination of such processing. The second gate dielectric processing step provides a different gate dielectric than the first gate dielectric, so that the threshold voltage of the second gate region is different than the first. Another option at this point is the application of a second threshold adjust implant, as shown by ion beam (64) and the threshold adjust implant layer (65). This ion implant may be a very light dose of range $1 \times 10^{13}$ cm$^{-2}$ of either conductivity type. In combination with the second gate dielectric, this implant would set the threshold voltage of the second gate region.

As illustrated in FIG. 4b, processing continues through the step of second gate electrode deposition, which is deposited to a thickness such that the total thickness is conventional. This deposition may be amorphous silicon or polysilicon. The next step, as shown in FIG. 4c, is the patterning of the second gate electrode deposition (54). The final transistor structure thus includes two regions, which have different gate dielectrics.

Next, a photoresist layer (55) is applied and patterned to expose the PMOS devices (i.e. drain extension regions 64 and 65) as shown in FIG. 4d. The drain extension (57) is then formed, by the implantation of a boron-containing ion beam (56). Typical conditions for this implant are an energy of 500 eV and a dose of $5 \times 10^{14}$ cm$^{-2}$, or boron cluster implant with process equivalent parameters. This implant also achieves self-alignment of the drain extension to the gate stack edge, in the conventional way. This implant will form a shallow doped layer (58) on the surface of the gate electrode, unless coverage is provided. At this point, the photoresist layer (55) is stripped, and insulating sidewall spacers (59) are formed on the sidewalls of the gate electrode, as shown in FIG. 4e. A new photoresist layer (62) is applied and patterned, again protecting NMOS regions and exposing PMOS regions (i.e. exposing source and drain regions 66 and 67, respectively). Next, ion beam (60) is implanted to form the source and drain regions (61). The implant also provides the gate electrode doping (63). At this point, the notched-gate transistor structure has been formed and the substrate would continue through a conventional CMOS fabrication sequence, through interlevel dielectric deposition, contact formation, metallization, etc. It may be noted that other variations of the notched-gate transistor can be formed by variation of this method.

One aspect of the present invention is to make certain that the combination of first deposition thickness, first implantation depth (implant energy) and heat treatment are such that no boron penetration of the gate oxide occurs. This requires that the first deposition be very thin and that the first implant be very shallow, and the heat treatment is chosen to minimize diffusion. In one embodiment of the present invention, cluster ion implantation may be used for the first implantation step to a first deposition thickness around 20 nm and a spike anneal for the heat treatment. This combination of process steps will provide the structure necessary to minimize gate depletion and boron penetration of the gate oxide. Typical conditions include: first deposition thickness 20 nm, first implant of decaborane at approximately 5 keV to a dose of $1 \times 10^{14}$ cm$^{-2}$, and a spike anneal to a temperature of 100° C. These conditions should ensure that no boron penetration of the gate dielectric occurs.

FIG. 5 demonstrates that appropriate implant conditions can be achieved. The simulations were performed using, for example, SRIM 2000, a program that calculates the depth and distribution of ions implanted into materials, as set forth in J. Ziegler et al., "The Stopping and Range of Ions in Solids; Pergamon Press, New York 1985. In this example, the nominal implant parameters are modeled to determine the depth profiles that result from the two implant processes. The first deposition (71) is modeled as a polysilicon deposition that is 15 nm thick. The first implant conditions are modeled as a 500 eV boron implant of $1 \times 10^{15}$ cm$^{-2}$ dose, with resulting profile (72) As seen in FIG. 6, none (<0.1%) of the implant reaches the gate oxide interface (75) and certainly none get through the gate dielectric into the underlying silicon. The second deposition (73) is modeled as a 125 nm deposition of polysilicon, followed by a boron implant with energy 2 keV and dose $5 \times 10^{15}$ cm$^{-2}$ with resulting profile (74). It is noted that the second implant profile (74) is fully contained with the gate electrode layer. For the NMOS device, arsenic ion implant would be used, and since arsenic is a higher mass atom, it's penetration depth is less and therefore no risk of gate penetration would exist.

Formation of Ultrashallow Junction

Another aspect of the present invention relates to the formation of an ultrashallow junction in a semiconductor substrate by implanting the desired dopant into a dielectric layer on the surface of the semiconductor substrate and diffusing the dopant out of the dielectric layer and into the semiconductor substrate to form a junction. A second species may be implanted into the dielectric layer, either at the same time as the dopant or subsequently, to alter the diffusion properties of the dielectric/dopant system. An example of such a method is the implantation of a boron hydride cluster into a silicon dioxide layer on a silicon wafer, wherein the hydrogen enhances the diffusion of boron through the oxide layer and thereby makes the formation of the boron ultrashallow junction more effective.

The process starts with a semiconductor substrate 1, as shown in FIG. 6. Typically, the semiconductor substrate is a silicon wafer, but it could be a III-V semiconductor substrate also. Further, the semiconductor substrate would typically have doping to some level, it will be assumed that the semiconductor substrate is doped n-type. On the surface of this semiconductor substrate, there is a thin dielectric layer, 2. This dielectric layer would typically be silicon dioxide or silicon nitride, but other materials are possible. The thickness of the dielectric layer is subject to optimization, but would likely be in the range of 5-20 nm in thickness. The dielectric layer is in contact with the semiconductor substrate (1) at the interface (3) between the two materials.

Figure 7:
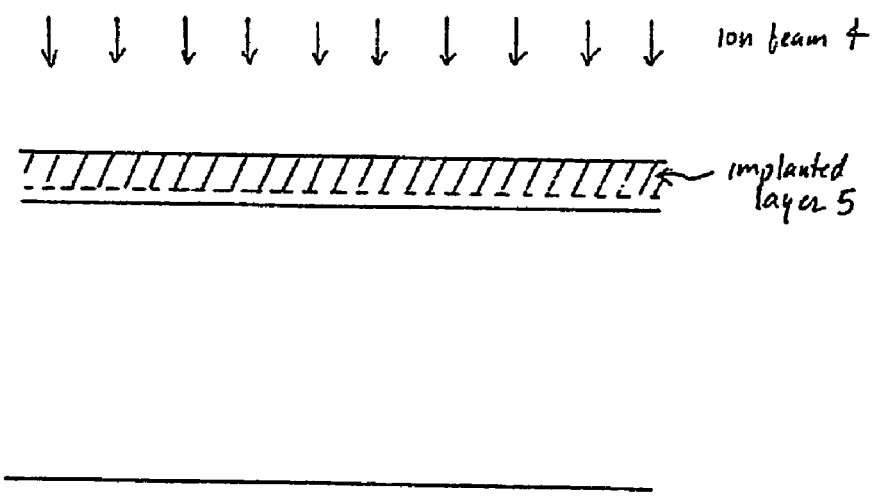
FIG. 7 is a diagram showing ion beam forming an ion implanted layer within dielectric layer in accordance with another aspect of the present invention.

As shown in FIG. 7, an ion beam (4) is directed at the surface, with sufficiently low energy that the ion implanted layer (5) is entirely contained within the dielectric layer. Ion beam (4) can represent either a single implant, such as a boron cluster ion, or a sequence of implants, such as a boron implant followed by a hydrogen implant. It may be desirable that the dopant species implanted layer be completely contained within the dielectric layer, as shown by implanted layer 5. For example, if the dielectric layer is silicon dioxide, and it is 20 nm in thickness, then a boron implant of 500 eV energy or less would be completely contained within the dielectric layer. It is desirable to have the second implant species entirely contained within the dielectric layer also, to increase it's effectiveness, but there is no impact on the resulting junction is a fraction of the second species enters the semiconductor substrate. Next, a heat treatment is applied, wherein the temperature and time have been optimized to provide enough diffusion for the dopant species to diffuse out of the dielectric layer 2, through the interface 3, and form a shallow junction 6 in the semiconductor substrate (1), as shown in FIG. 8.

This method has several features that make it attractive for implanting directly into a semiconductor substrate. First, the implantation process necessarily introduces crystal defects into the semiconductor substrate, which are detrimental to achieving good electrical properties of the junctions being fabricated. Containing the implant damage to the dielectric layer is beneficial both to the semiconductor devices being fabricated and to the junction formation process itself. This is because the implantation defects do not cause degradation of the dielectric layer since it is noncrystalline, and the defects will enhance the diffusion of the dopant through the dielectric layer.

The method discussed above relaxes the constraints on the heat treatment process used to make the implanted dopant electrically active. The goal of the heat treatment is to place the dopant into substitutional sites within the semiconductor lattice, allowing the dopant to bond with the semiconductor atoms and thereby gain its electrical activity within the semiconductor system. In a conventional process, the implanted dopant occupies mostly interstitial sites and a high temperature annealing step is required to place the dopant into substitutional, electrically active sites. This high temperature process allows for substantial diffusion of the implanted dopant, however, which acts against the formation of ultrashallow junctions. In the conventional process, the optimization is reached with a spike anneal, wherein the temperature of the annealing step is ramped to the highest temperature and immediately ramped back down, in order to achieve electrical activity with the minimum diffusion. With the proposed process, all of the dopant in the semiconductor reached its position by diffusing, which means that it is substitutional since the diffusing process is substitutional. Thus, a different optimization of the annealing step is required, since the anneal is now chosen to diffuse the dopant through the dielectric layer and just into the semiconductor substrate. It is expected that this is better accomplished with a lower temperature process with finite time, rather than the spike anneal.

The process in accordance with the present invention is more effective than that discussed by the Schmitz reference, supra, and includes the introduction of a second species, for example, hydrogen. The diffusion of boron in silicon dioxide is slower than the diffusion of boron in silicon, presenting a limitation to the efficiency of the formation of high concentration junctions. One way to manage this limitation is the enhancement of the diffusion rate in the dielectric by the introduction of hydrogen. It is shown by Fair that the presence of hydrogen can enhance the diffusion rate by a factor of two. The implantation of the hydrogen is an attractive process relative to the alternatives, which would normally be the introduction of hydrogen from the ambient during diffusion. Since the annealing process is high temperature (>800 C.), hydrogen is a dangerous gas to use as the annealing ambient, since it is flammable in contact with air. The normal means of performing a hydrogen diffusion in semiconductor technology is the use of an ambient composed of a mixture of hydrogen and nitrogen, since the mixture is much safer. However, the nitrogen effect is to retard the diffusion of boron in silicon dioxide, so the safe mixture does not provide much benefit. Implantation of the hydrogen is a very safe and effective way to enhance the diffusion of boron in silicon dioxide.

A further aspect of the invention is the relaxation of many of the implant constraints in the normal process. These constraints include the implant dose and the implant energy. One aspect of this method is the enhanced utility of higher dose implants. In a conventional process where the implant is directly into the semiconductor substrate, there is a limit to the amount of dopant that can be implanted effectively, due to the formation of alternative phases of various materials that render the dopant ineffective. For example, for the case of boron implant into silicon, when the implanted concentration exceeds the solid solubility of boron at the annealing temperature, the excess boron precipitates as a silicon boride phase, which renders the boron electrically inactive and very difficult to recover. This mechanism places an upper limit on the amount of electrically active boron that can be achieved by the conventional process. In the proposed method, the implanted dopant goes into an amorphous dielectric layer, where no alternative phase materials have been observed. Thus, all of the implanted boron contributes to the process of formation of the ultrashallow junction, through the establishment of a diffusion profile through the dielectric layer. It is very beneficial to this process that the diffusion profile contains concentrations exceeding the solid solubility of boron in the semiconductor, for example, since that can increase the flow of dopants diffusing to the semiconductor surface. Another aspect of the proposed method is that implanting into a surface dielectric layer can allow the implant energy to be increased. The conventional method carries the requirement of extremely low implant energy because the implant depth is a critical factor in establishing the ultrashallow junction. In the proposed process, the implant energy is related to the dielectric layer thickness, which can be chosen to optimize the process. It is desirable to keep the oxide layer thin and utilize a low energy implant, but this preference is to make the diffusion more effective rather than directly impacting the junction depth. Since the implant productivity is directly related to implant energy, the proposed method is preferred.

Another aspect of the proposed method is the use of implanting the second species as a means of avoidance of some detrimental effects of this species. In particular, using the example of boron diffusion enhancement by hydrogen, it is detrimental to enhance the diffusion of boron through the gate oxide layer, which occurs when anneals are performed in a hydrogen ambient, or excess hydrogen is available during any high temperature treatment. In the proposed method, the implantation of hydrogen places it exactly in the region where boron diffusion is desired and it is masked out of other regions of the circuit. A further aspect of this method is that only sufficient hydrogen is introduced, since any excess hydrogen would be available to diffuse to other regions and detrimentally enhance diffusion where it is undesirable. Since the enhancement effect is believed to be attachment of the hydrogen to the diffusing boron and diffusing as a cluster, a ration of 1/1 is the ideal amount of hydrogen to introduce into the process. With implantation, this hydrogen is placed exactly in the volume wherein the boron is present and diffusing. The conventional methods, such as annealing in a hydrogen ambient, introduce copious amounts of hydrogen into all regions of the semiconductor substrate, allowing for enhanced diffusion is regions where it is undesirable. A further embodiment of the proposed method would be to implant the two species separately, enabling the option of masking the second species differently than the first species, such that only certain regions implanted with the first species receive the diffusion enhancement. In this way, two different optimizations of the Source/Drain Extension could be achieved with only masking of the second implant. This would be useful in a process whereby various transistors with different properties are being fabricated with a single process flow, which is typical in modern semiconductor fabrication processes.

For this aspect of the invention, it is highly undesirable that the dopant implant be performed on a decel type implanter. This is due to the presence of energy contamination in the beam of every decel implanter, to some degree. For commercially available systems, this energy contamination is in the range of 0.1-1.0% for production viable processes. In the conventional shallow junction process, this contamination, which is a fraction of the beam at higher energy, penetrates more deeply into the semiconductor substrate and forms a tail on the implanted profile, which can generally be managed in the process optimization. In the proposed process this contamination is more detrimental, since the higher energy beam will penetrate through the surface dielectric layer and into the semiconductor substrate, forming an implanted region which is not desired. Since it is likely that the proposed process would utilize a higher dose than the conventional process, the contamination concentration in the semiconductor would be proportionally higher than in the conventional case, exacerbating the problem. Thus the preferred embodiment of this method would be a cluster implant in drift mode, whereby both species of interest are implanted at the same time without the presence of higher energy contamination.

The present invention has been described, along with several embodiments. The present invention is not limited thereto. For example, it will be apparent to those skilled in the art that various modifications, alterations, improvements and combination thereof are possible.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

We claim:

1. A method for forming a gate electrode for a metal oxide semiconductor device having a substrate and formed with a well and opposing trench isolation portions with a first dielectric layer formed thereon, the method comprising the steps of:
    (a) depositing a first gate electrode layer of a predetermined thickness on said first dielectric layer defining an interface,;
    (b) doping said first gate electrode layer with a first dopant, defining a doped first gate electrode layer;
    (c) depositing a second gate electrode layer directly on said doped first gate electrode layer;
    (d) doping said second gate electrode layer with a second dopant defining a doped second gate electrode layer, said doped first gate electrode layer and said doped second gate electrode structure forming a structure; and
    (e) heat treating said structure to activate said first dopant and said second dopant with a heat treating temperature profile.

2. The method as recited in claim 1, wherein the said first gate electrode layer and said second gate electrode layer together form said gate electrode.

3. The method as recited in claim 1, wherein the step of depositing a first gate electrode layer comprises depositing amorphous silicon.

4. The method as recited in claim 1, wherein the step of depositing a first gate electrode layer comprises depositing polysilicon.

5. The method as recited in claim 1, wherein the step of depositing a second gate electrode layer comprises depositing amorphous silicon.

6. The method as recited in claim 1, wherein the step of depositing a second gate electrode layer comprises depositing polysilicon.

7. The method as recited in claim 1, wherein said step of doping said first gate electrode layer comprises doping said first gate electrode layer with boron.

8. The method as recited in claim 1, wherein said step of doping said first gate electrode comprises doping said first gate electrode layer with decaborane.

9. The method as recited in claim 1, wherein said step of doping said second gate electrode layer comprises doping said second gate electrode layer with boron.

10. The method as recited in claim 1, wherein said step of doping said second gate electrode comprises doping said second gate electrode layer with decaborane.

11. A method for forming a metal oxide semiconductor (MOS) device having a substrate, comprising the steps of:
    (a) forming a well and opposing trench isolation portions in said first substrate;
    (b) depositing a first dielectric layer thereon of a predetermined thickness; defining an interface,;
    (c) depositing a said first gate electrode layer on said first dielectric layer;
    (d) doping said first gate electrode layer, defining a doped first gate electrode layer;
    (e) depositing a second gate electrode layer directly on said doped first gate electrode layer;
    (f) forming a gate stack from the combination of said doped first gate electrode layer and said second gate electrode layer, resulting in exposed portions of said first dielectric layer;
    (g) patterning a first photoresist to expose drain extension regions on said first dielectric layer adjacent to said trench isolation portions;
    (h) doping said exposed portions of said gate stack and said first dielectric layer forming drain extensions in said well between said trench isolation portions and said gate stack;
    (i) removing said first photoresist and patterning a second photoresist to form spacers adjacent opposing sides of said gate stack and exposing portions of said first dielectric layer defining drain and source regions;
    (j) doping said exposed portions of said first dielectric layer to form source and drain layers within said well;
    (k) removing said second photoresist layer; and
    (l) providing heat treatment to diffuse the implanted dopant to cause said implanted dopant to diffuse out of said first dielectric layer into said well.

12. The method as recited in claim 11, wherein said step of doping said first gate electrode layer comprises doping said first gate electrode layer with boron.

13. The method as recited in claim 11, wherein said step of doping said first gate electrode layer comprises doping said first gate electrode layer with a boron cluster implant.

14. The method as recited in claim 11, wherein said step of doping said first gate electrode layer comprises doping said first gate electrode layer with a molecular implant.

15. The method as recited in claim 11, wherein the step of doping said drain and source regions comprises doping said drain and source regions with boron.

16. The method as recited in claim 11, wherein the step of doping said drain and source regions comprises doping said drain and source regions with a boron cluster.

17. A method for forming a metal oxide semiconductor device having a substrate, comprising the steps of:
    (a) forming a well and opposing trench isolations in said substrate;
    (b) depositing a thin first dielectric layer thereon of a predetermined thickness; defining an interface, the thickness of said first gate electrode layer selected to minimize gate depletion adjacent said interface;
    (c) depositing a first gate electrode layer directly on said first dielectric layer;
    (d) forming said first gate electrode layer into a gate stack leaving exposed portions of said first dielectric layer;

(e) patterning a first photoresist layer to expose drain extension regions of said first dielectric layer;
(f) doping said drain extension regions forming drain extension layers and said well;
(g) removing said first photoresist layer;
(h) depositing a second gate electrode layer;
(i) forming said second gate electrode stack to be offset and larger than said gate stack formed from said first gate electrode layer;
(j) patterning a second photoresist layer to form spacers adjacent said second gate electrode stack to define drain and source regions;
(k) doping said drain and source regions to form drain and source layers in said well; and
(l) removing said second photoresist layer; and
(m) providing heat treatment to cause said implanted dopants to activate material implanted by said doping step.

18. The method as recited in claim 17, wherein said step of doping said drain extension regions comprises doping said drain extension regions with decaborane.

19. A method for forming a metal oxide semiconductor (MOS) device having a substrate, the method comprising the steps of:
(a) forming a well and opposing trench isolations in said substrate;
(b) depositing a first dielectric layer thereon;
(c) depositing a first gate electrode layer on said first dielectric layer of a predetermined thickness; defining an interface,;
(d) forming said first gate electrode layer into an initial gate stack leaving exposed portions of said first dielectric layer;
(e) doping said gate stack and said exposed surfaces of said first dielectric layer;
(f) depositing a second gate dielectric layer, different than said first dielectric layer directly on said exposed surfaces of said first dielectric layer;
(g) depositing a second gate electrode deposition layer on top of said initial gate stack and said second dielectric layer;
(h) forming the second gate electrode deposition into a final gate stack;
(i) patterning a first photoresist to expose said final gate stack and drain extension regions;
(j) doping said final gate stack and said drain extension regions;
(k) removing said first photoresist;
(l) patterning a second photoresist to form side wall spacers adjacent to said final gate stack and to expose said drain and source regions;
(m) doping said drain and source regions and said final gate electrode stack to form drain and source layers in said well;
(n) removing said second photoresist layer; and
(o) providing heat treatment to activate material implanted by said doping step.

20. The process as recited in claim 19, wherein step (f) comprises implanting a species into said first dielectric layer.

21. The process as recited in claim 19, wherein step (b) comprises chemical treatment of the first dielectric layer.

22. The process as recited in claim 19, wherein step (b) comprises removal of said first dielectric layer and regrowth of a second dielectric material different from said first dielectric material.

23. The process as recited in claim 1, wherein said first and second gate electrode layers together total a thickness of a conventional gate electrode layer.

* * * * *